United States Patent [19]
Hanibuchi et al.

[11] Patent Number: 5,317,206
[45] Date of Patent: May 31, 1994

[54] BUFFER CIRCUIT USING CAPACITORS TO CONTROL THE SLOW RATE OF A DRIVER TRANSISTOR

[75] Inventors: Toshiaki Hanibuchi; Masahiro Ueda, both of Hyogo, Japan

[73] Assignee: Mitsubishi Denki Kabushiki Kaisha, Tokyo, Japan

[21] Appl. No.: 980,877

[22] Filed: Nov. 24, 1992

[30] Foreign Application Priority Data

May 14, 1992 [JP] Japan .................................. 4-122020

[51] Int. Cl.⁵ .......................... H03K 19/07; H03K 5/12
[52] U.S. Cl. ...................................... 307/443; 307/246; 307/263
[58] Field of Search ................ 307/443, 448, 451, 475, 307/246, 263

[56] References Cited

U.S. PATENT DOCUMENTS

| | | | |
|---|---|---|---|
| 4,760,279 | 7/1988 | Saito et al. | 307/443 |
| 4,908,528 | 3/1990 | Huang | 307/448 |
| 4,973,861 | 11/1990 | Difken | 307/448 |
| 5,017,807 | 5/1991 | Kriz et al. | 307/263 |
| 5,120,992 | 6/1992 | Miller et al. | 307/443 |

FOREIGN PATENT DOCUMENTS

| | | |
|---|---|---|
| 60-136238 | 7/1985 | Japan . |
| 61-260719 | 11/1986 | Japan . |
| 1-174009 | 7/1989 | Japan . |

*Primary Examiner*—Edward P. Westin
*Assistant Examiner*—Benjamin D. Driscoll
*Attorney, Agent, or Firm*—Lowe, Price, LeBlanc & Becker

[57] ABSTRACT

First and second capacitor circuits responsive to a potential applied to an input node for instantaneously supplying a voltage derived by capacitance division to control electrodes of first and second output MOS transistors which drive an output node. When the output node reaches a predetermined potential level, the control electrode node of the first output transistor or the control electrode node of the second output transistor is driven to ground potential or power supply potential by the MOS transistor responding to a delay signal of an input signal. A smaller buffer circuit which has improved output response and reduced through current is described. The output signal transitioning speed can also be easily altered.

13 Claims, 15 Drawing Sheets

(a) $V_{IN}$ (b) $V_{OUT}$ (a) $V_{IN}$ (b) I (c) $V_{dd}$ (d) $V_{ss}$ (e) $V_{OUT}$

BUFFER CIRCUIT USING CAPACITORS TO CONTROL THE SLOW RATE OF A DRIVER TRANSISTOR

BACKGROUND OF THE INVENTION

1. Field of the Invention

The present invention relates to a buffer circuit for buffering an incoming signal, and more particularly, to an output buffer circuit provided at the signal output portion of a semiconductor device such as a semiconductor integrated circuit device.

2. Description of the Background Art

A semiconductor device such as a semiconductor integrated circuit device includes a buffer circuit for signal waveform shaping or for driving a circuit of the succeeding stage at a high speed. One of such buffer circuits is a buffer circuit for externally providing a signal internally processed in a device (or in a functional block).

FIG. 14 schematically shows a structure of a semiconductor device which is one of conventional semiconductor integrated circuit devices. Referring to FIG. 14, a semiconductor device 500 includes an internal circuit 502 for carrying out a desired process on an input signal D, and an output buffer 504 for buffering a signal from the internal circuit 502. The output of the output buffer 504 is provided to the input portion of an external circuit 510 provided separately from the semiconductor device 500. The semiconductor device 500 may be of one semiconductor chip, or a functional block that executes one function in a semiconductor chip. The output buffer 504 drives at high speed an output signal line (the signal line between the output buffer 504 and the external circuit 510) according to a signal provided from the internal circuit 502.

FIG. 15 shows a structure of a conventional output buffer circuit. Referring to FIG. 15, an output buffer circuit 520 includes two cascade-connected inverter circuits 522 and 524. The output of the output buffer circuit 520 is supplied to the input of the external circuit 510 of FIG. 14. In general, there is impedance in the input portion of a circuit. This impedance is shown as an external load circuit 530 in FIG. 15. The external load circuit 530 includes a parasitic impedance with a capacitive load 532 and a resistive load 534 provided parallel to each other.

The output buffer circuit 520 has a great driving capability for driving the external load circuit 530 speedily and properly. The driving capability of the inverter circuit 524 is particularly of a great value.

In operation, the output buffer circuit 520 responds to an input signal VIN to charge and discharge the capacitive output load 532 included in the external load circuit 530. The signal VOUT provided from the output buffer circuit 520 varies according to a time constant determined by the capacitance and resistance of the capacitive load 532 and the resistive load 534, respectively, of the external load circuit 530.

There is a parasitic inductance 536 in addition to the parasitic capacitance (included equivalently in the capacitive load 532) in the signal line. Switching noise occurs by this parasitic inductance when the output signal VOUT from the output buffer circuit 520 changes at a high rate.

There is a change in the current in the output signal line when the logic level of the output signal VOUT from the output buffer circuit 520 changes. Voltage is induced in the parasitic inductance 536 according to this current change. The magnitude of the voltage induced by the parasitic inductance 536 is proportional to the changing rate of the current. The induced voltage by the parasitic inductance 536 is generated in a direction opposite to the voltage change of the output signal from the output buffer circuit 520. Therefore, ringing occurs in the output signal VOUT from the output buffer circuit 520 to cause overshooting and undershooting in the signal, as shown in FIG. 16. The generation of ringing such as overshooting and undershooting is time-consuming for the signal to attain its stable state, resulting in decrease in the circuit operation speed.

As an integrated circuit device is increased in speed, the changing speed of the output signal VOUT from the output buffer circuit 520 becomes greater. In this case, the induced voltage is also increased to deteriorate the circuit operation as "switching noise". Particularly, the induced voltage by the parasitic inductance 536 is transmitted to ground potential via a pull down transistor of the inverter circuit 524 included in the output buffer circuit 520. Therefore, a phenomenon called "ground bounce" (corresponding to the ringing generated at the fall of the output signal VOUT in FIG. 16) is generated whereby the ground potential of the semiconductor device 500 in FIG. 14 changes to degrade the circuit operation.

More specifically, when the output buffer 500 according to the structure shown in FIG. 14 provides a signal of a L level, there may be a case where the level of this signal will become greater than the threshold voltage of the input element in the input portion of the external circuit 510 on account of the induced voltage, resulting in an erroneous determination in the external circuit 510 that a signal of a H level is provided from the output buffer 504. Furthermore, because the threshold voltage of the input buffer (not shown) in the semiconductor device 500 of the configuration in FIG. 14 is changed by the ground bounce, a negative ground bounce will cause the threshold voltage of the input buffer of the semiconductor device 500 to be lower than the L level of the input signal D to yield a problem of erroneous operation.

When the load of the external load circuit 530 is great, the output buffer circuit 520 has a great driving capability for driving the external load circuit 530 at a high speed. In this case, the change in the output signal from the output buffer circuit 520 is abrupt. As shown in FIG. 17, there is caused a great current flow in the power supply line or ground line at the time of change in the signal. The power supply line or ground line has a relatively great parasitic inductance by the lead frame or bonding wire in a package. Therefore, a noise called "voltage spike" is generated in the power potential Vdd or ground potential Vss according to the great current change to cause ringing in the output signal VOUT from the output buffer circuit, causing a problem that erroneous operation tends to occur in the external circuit 510.

Even if the power supply current or ground current is not great, any abrupt change in current will cause a generation of noise in the power supply line and or ground line by the parasitic inductance component thereof. Because the power supply line and the ground line are connected to many circuits in the semiconductor device, the noise in the power supply line or ground line will become the cause of erroneous operation in the semiconductor device or the external device.

If the change in the output signal from the output buffer is abrupt, a similar noise will be generated even if the external load is not so great. Consider a case where the output buffer 504 includes four output buffer circuits 550, 552, 554, and 556 as shown in FIG. 18. Each of output buffer circuits 550-556 implements a CMOS inverter circuit. A power supply line and a ground line are connected in common to output buffer circuits 550-556 to provide operating power supply potential Vdd and ground potential Vss.

Consider a case where the input signal VA of the output buffer circuit 550 remains at the H level, and the remaining input signals VB, VC, and VD rise from the L level to the H level. In this state, the output of the output buffer circuit 550 attains an L level, and the outputs of the remaining output buffer circuits 552, 554 and 556 fall to the L level. When the output signal attains a L level, the charges of external load capacitors 562, 564, and 566 are discharged to the ground line. If the signal change in output buffer circuits 552, 554 and 556 is abrupt, discharge current I flows abruptly from external load capacitors 562, 564 and 556 to the ground line. This means that a great discharge current flows abruptly to the ground line to change the potential Vss of the ground line (illustrated by N in FIG. 18). The noise (voltage spike N) generated in the ground line is provided via the output buffer circuit 550 to be superimposed on the output signal VAO. Therefore, there is a possibility of the output signal VAO being erroneously determined as an H level.

In the reversed case where the input signal VA is fixed to a L level, and the remaining input signals VB, VC and VD change from the H to L level, a charging current will flow abruptly to external load capacitors 562, 564 and 566 from the power supply line supplying power supply potential Vdd to generate noise in power supply potential Vdd. This noise is provided via the output buffer circuit 550 to generate noise in the output signal VAO.

Because a buffer circuit using an inverter circuit and the like has an abrupt change in the output signal, noise or ringing will be generated in the output signal, or noise such as voltage spike will be generated in the power supply line or ground line due to an abrupt change in the charging/discharging current in driving an external load, resulting in erroneous operation. Various measures are taken to reduce such noise.

FIG. 20 shows a structure of a conventional output buffer circuit, disclosed in Japanese Patent Laying-Open No. 60-136238, for example. Referring to FIG. 20, the output buffer circuit includes inverter circuits 103 and 101 cascade-connected in two stages. The inverter circuit 100 includes a p channel MOS transistor 101 and an n channel MOS transistor 102 complementarily connected between a power supply node 1 supplying power supply potential Vdd and a ground node 2 providing ground potential Vss. Transistors 101 and 102 have their transistor sizes increased for driving external load, and has a great current driving capability. The output buffer further includes a capacitor 104 provided between the output portion of the inverter circuit 103 and the input portion of the inverter circuit 100. The capacitor 104 has one electrode connected to the node 103a and the other electrode connected to the ground node 2 supplying ground potential Vss. The operation thereof will be described hereinafter with reference to FIG. 21 which is an operational waveform diagram thereof.

When the input signal applied to the input node 3 rises from the L level to the H level, the output of the inverter circuit 103 falls from the H level to the L level. This change in the output level of the inverter circuit 103 is equivalent to discharging of the charges in the capacitor 104. Therefore, the potential in the node 103a falls slowly. When the potential level of the node 103a becomes lower than the threshold voltage 101a of the p channel MOS transistor 101 included in the inverter circuit 100, the p channel MOS transistor 101 conducts, whereby a charging current from the power supply node 1 begins to flow to the output node 4. In response to the decrease of potential in the node 103a, the transistor 101 makes gradual transition towards the on state and the transistor 102 is gradually brought to the off state, whereby the potential of the output node rises slowly. By decreasing the potential rising speed of the output node 4, current can be prevented from flowing abruptly from the power supply node 1 to suppress the generation of abrupt current change in the power supply line to prevent noise generation. When the potential of the node 103a reaches the L level of the ground potential Vss level, transistors 101 and 102 are turned on and off, respectively, whereby the potential of the output node 4 is maintained at the power supply potential Vdd level of H.

When the signal provided to the input node 3 falls from the H to L level, the output of the inverter circuit 103 rises from the L to H level. The rising speed of the output of the inverter circuit 103 is rate-determined by the charging speed of the capacitor 104. Therefore, the rise of the input signal of the inverter circuit 100 is decreased in speed. When the potential of the node 103a becomes greater than the threshold voltage 102a of the n channel MOS transistor 102, the n channel MOS transistor 102 conducts, so that the output node 4 is discharged to ground potential Vss2. Therefore, the potential of the output node 4 begins to fall slowly.

When the node 103a eventually reaches the power supply potential Vdd level of H, transistors 101 and 102 are turned off and on, respectively, whereby the output node 4 is maintained at the ground potential Vss level of L. By mitigating the signal change in driving the output node 4 to a L level, the changing speed of current flowing into the ground node 2 can be lowered to decrease the current changing speed of the ground line to reduce noise generation.

In other words, the generation of ringing in the signal in the power supply line, the ground line, or the output signal line or noise such as a voltage spike can be prevented by decreasing the changing speed of current flowing into the power supply line or the ground line.

Why the potential changing speed of the output node 4 depends upon the potential changing speed of the node 103a is that the current amount supplied from a MOS transistor is determined by the gate voltage. (In saturated operation, the drain current Id is proportional to the square of the gate voltage Vg.)

In the output buffer circuit of FIG. 20, the input node 103a of the inverter circuit 100 provided at the output stage has the potential changing speed decreased. Therefore, the time period of the gate voltage of an intermediate value is increased in the p channel MOS transistor 101 and the n channel MOS transistor 102. Therefore, the time when both transistors 101 and 102 simultaneously attain a conductive state is increased, whereby a through-current flows from the power supply node 1 to the ground node 2, resulting in increased wasteful consumed current.

The time point of the inverter circuit 101 of the output stage initiating its operation is when the potential of the node 103a becomes lower than the threshold voltage 101a of the p channel MOS transistor 101 or higher than the threshold voltage 102a of the n channel MOS transistor 102. Therefore, for initiation in the potential change of the output node 4, delay times of D1 and D2 are respectively required from the time point of change in the signal applied to the input node 3. This means that the delay in the output buffer circuit is increased to degrade the high speed response characteristics (delay characteristics), resulting in lowering of the high speed operation performance of the overall device.

An output buffer circuit such as one shown in FIG. 22 is proposed to solve such problems of through-current and response characteristics.

FIG. 22 is a modification of a conventional output buffer circuit, and is disclosed in, for example, Japanese Patent Laying-Open No. 61-260719. The output buffer circuit of FIG. 22 includes a buffer circuit 201 having a relatively small driving capability and responsive to a signal applied to the input node 3 for driving the output node 4, a three-state buffer circuit 202 having a relatively high driving capability and a high impedance output state, responsive to a signal on the input node 3 for driving the output node 4, and a control circuit 203 for controlling the operation of the buffer circuit 202 according to the signal potentials of the input node 3 and the output node 4.

The control circuit 203 includes a match detection circuit 211 for receiving the signal on the input node 3 and the signal on the output node 4, and an inverter circuit 212 for receiving the output of the match detection circuit 211. The output of the inverter circuit 212 is supplied to the control terminal of the three-state buffer circuit 202. The buffer circuit 20 is made of small transistors which gives it relative small driving capability. The three-state buffer circuit 202 is made of large transistors which gives it great driving capability. The operation thereof will be described with reference to FIG. 23 which is an operation waveform diagram thereof.

When the potential of the signal supplied to the input node 3 rises to a H level, the buffer circuit 201 raises the potential of its output node. Because the driving capability of the buffer circuit 201 is small, the potential of the output node 4 rises slowly. Because the potential of the output node 4 has not yet thoroughly reached an H level when the potential of the input node 3 attains a H level, the match detection circuit 211 in the control circuit 203 will have different potential logic values in the inputs to provide a signal of a L level, whereby the potential of the signal provided from the inverter circuit 212 to the node 205 rises to a H level. Therefore, the three-state buffer circuit 202 enters a high impedance output state.

When the potential of the output node 4 reaches a certain potential, the potential levels of the input node 3 and the output node 4 will match to result in an output of a H level from the match detection circuit 211, whereby the signal provided from the inverter circuit 212 to the node 205 attains an L level. Therefore, the three-state buffer circuit 202 becomes active to drive the output node 4 to a H level by its great driving capability. Then, the output node 4 is driven by the three-state buffer circuit 202 having a great driving capability, whereby the potential level is stabilized led at the H level.

In the case where the signal provided to the input node 3 falls to a L level from the H level, the output of the match detection circuit 211 becomes L in response to the decrease in potential of the input node 3, which in turn causes the output of the node 205 to attain a H level. As a result, the three-state buffer circuit 202 attains a high impedance output state, so that the output node 4 is driven by the buffer circuit 201 of a small driving capability to have its potential level falling slowly. When the potential of the output node 4 falls to a predetermined level, the output of the match detection circuit 211 and then the potential level of the node 205 attain the L level. Therefore, the three-state buffer circuit 202 is activated, whereby the output node 4 is driven at a high speed to a L level. In this state, the output node 4 is held stably at the L level by the buffer circuit 202 of a high driving capability.

In summary, according to the configuration of the buffer circuit of FIG. 22, the output node 4 is driven by the buffer circuit 201 in response to a signal applied to the input node 3 to decrease the speed of the potential change in the output node 4, and the output node 4 is driven by a buffer circuit 202 of a great driving capability when the potential of the output node 4 approaches a target value so that the driving capability under a stable state is increased to stabilize the signal potential of the output node 4.

Because the output node 4 is driven by the buffer circuit 201 in response to a signal applied to the input node 3 in the buffer circuit of FIG. 22, the problem of delay in the signal response characteristics is solved. Furthermore, the matter of reducing the current consumption is also achieved because the through-current flows only for a short time period even if buffer circuits 201 and 202 are implemented with a CMOS transistor, by virtue of the input signal change at the input node 3 being directly provided to buffer circuits 201 and 202.

However, the buffer circuit of FIG. 22 is increased in circuit size because two buffer circuits of a buffer circuit 201 and a three-state buffer circuit 202 are required. In a semiconductor integrated circuit, the occupying area of such buffer circuit will become great, to provide a great bottleneck against increasing the integration density.

When the potential changing speed of the output node 4 is to be decreased, the potential changing speed is determined uniquely by the driving capability of the buffer circuit 201. The driving capability of the buffer circuit 201 is determined by the size of the transistor which is a circuit component. The current supplying capability particularly depends upon the gate width W when a MOS transistor (insulated gate type field effect transistor) is used. Therefore, there is a problem that it is difficult to set the potential changing rate in the output node 4 to a desired value. Also, the discharging/charging current of a MOS transistor depends upon the drain current IDS which is proportional to the ratio of the gate width W to the gate length L, i.e. to W/L. Once the transistor size is determined, it is difficult to modify the size after manufacturing, causing a problem that a desired current/potential changing speed can not be easily obtained.

SUMMARY OF THE INVENTION

An object of the present invention is to provide a buffer circuit superior in delay characteristics, and reduced in occupying area and current consumption, and that can easily provide a desired output signal changing speed.

A buffer circuit according to the present invention supplies a control voltage derived by capacitance division to control an output element driving an output node. When the potential of the output node reaches a predetermined potential level, the control voltage is set to stabilize the potential at the output node.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
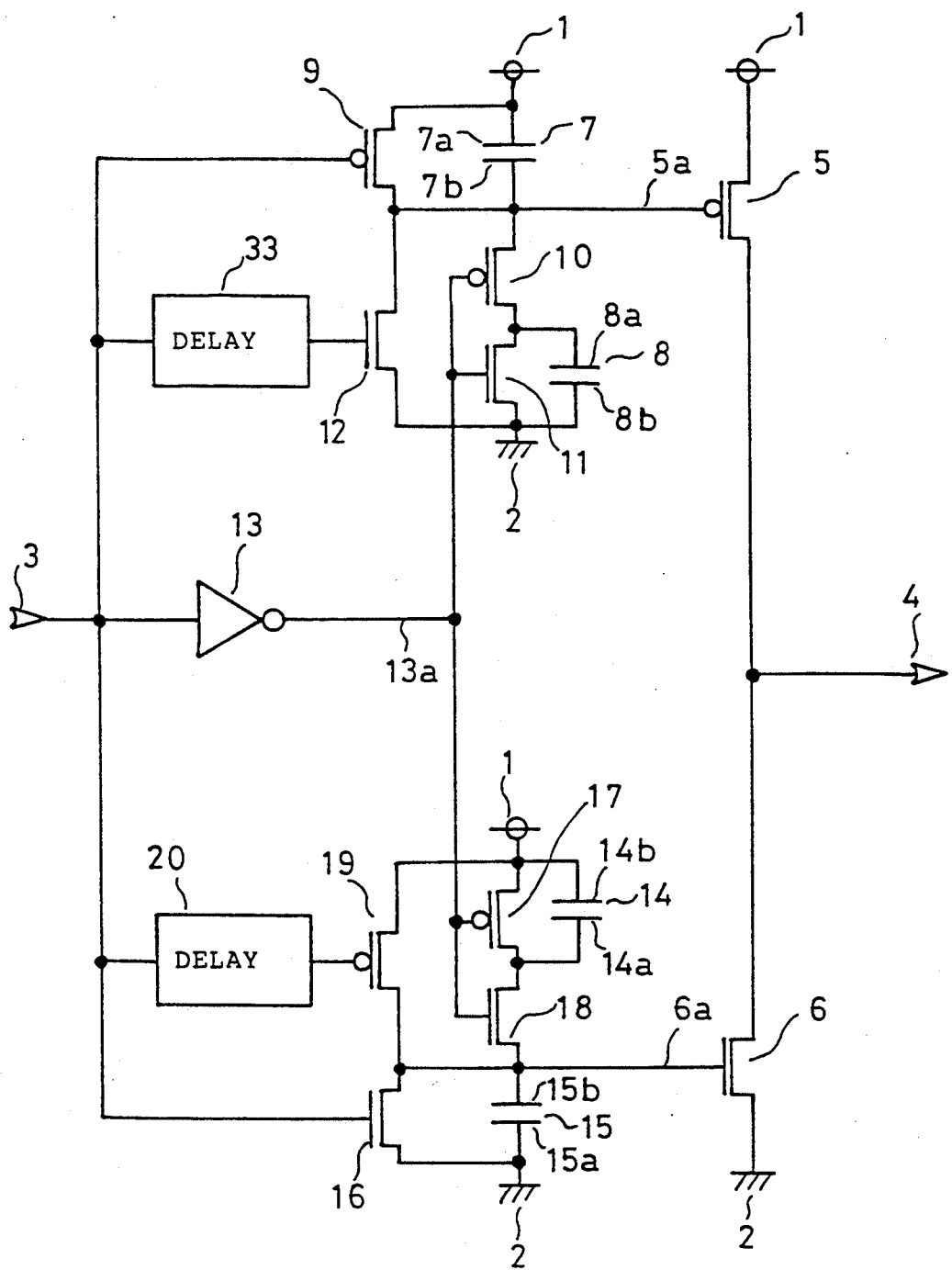
FIG. 1 shows a structure of a buffer circuit according to an embodiment of the present invention.

FIG. 1 shows a structure of a buffer circuit according to a first embodiment of the present invention. Referring to FIG. 1, a buffer circuit includes a p channel MOS transistor 5 coupled to a power supply node 1 providing an operating power supply potential Vdd, and responsive to a signal applied to a control electrode node 5a for driving the output node 4 to a level of the operating power supply potential Vdd, and an n channel MOS transistor 6 coupled to a ground node 2 supplying ground potential Vss, and responsive to a signal applied to a control electrode node 6a for driving the output node 4 to a level of ground potential Vss.

The buffer circuit further includes a capacitor 7 coupled between the power supply node 1 and the control electrode node 5a, a p channel MOS transistor 9 responsive to a signal applied to the input node 3 for short-circuiting/open-circuiting one electrode 7a and the other electrode 7b of the capacitor 7, a capacitor 8 having one electrode 8d connected to the ground node 2, an n channel MOS transistor 11 receiving a signal of the input node 3 at its gate via an inverter circuit 13 for short-circuiting/open-circuiting the one electrode 8b and the other electrode 8a of the capacitor 8, and a p channel MOS transistor 10 responsive to an output signal from the inverter circuit 13 for connecting the other electrode 8a of the capacitor 8 to the control electrode node 5a.

The buffer circuit further includes a delay circuit 33 for delaying the signal applied to the input node 3 for a predetermined time, and an n channel MOS transistor 12 responsive to the output of the delay circuit 33 for coupling the control electrode node 5a to the ground node 2. Transistors 9 and 10 are turned on and off substantially at the same phase, and transistors 10 and 11 are turned on and off in a complementary manner.

The buffer circuit further includes a capacitor 15 provided between the control electrode node 6a of the transistor 6 and the ground node 2, an n channel MOS transistor 16 responsive to a signal provided to the input node 3 for short-circuiting/open-circuiting one electrode 15a and the other electrode 15d of the capacitor 15, a capacitor 14 having one electrode 14b coupled to the power supply node 1, a p channel MOS transistor 17 responsive to an output signal of the inverter circuit 13 for short-circuiting/open-circuiting one electrode 14a and the other electrode 14b of the capacitor 14, and an n channel MOS transistor 18 responsive to an output signal from an inverter circuit 13 for connecting the other electrode 14a of the capacitor 14 to the control electrode node 6a. Transistors 18 and 16 are turned on and off substantially at the same phase, and transistors 17 and 18 are turned on and off in a complementary manner.

The buffer circuit further includes a delay circuit 20 for delaying a signal provided to the input node 3 for a predetermined time, and a p channel MOS transistor 19 responsive to an output signal from the delay circuit 20 for coupling the control electrode node 6a to the power supply node 1. The operation of the buffer circuit of FIG. 1 will be described with reference to FIG. 2 which is a operation waveform diagram thereof.

Consider the state where the potential of the input node 3 attains a L level. In this state, the transistor 9 is turned on, and the transistor 16 is turned off. The signal provided from the inverter circuit 13, i.e. the signal of node 13a attains a H level. Therefore, transistors 11 and 18 are turned on, and transistors 10 and 17 are turned off.

Because the transistor 9 is at an ON state, the control electrode node 5a attains a level of the power supply potential Vdd (signal 50). Therefore, the transistor 5 is off. Capacitors 7 and 8 are shorted by transistors 9 and 11, respectively, and the other electrode 8a of the capacitor 8 is isolated from the control electrode node 5a. Because the output of the delay circuit 33 attains a L level under this state, transistor 12 is off.

Regarding transistor 6, transistor 19 is on, and the control electrode node 6a attains a level of the power supply potential Vdd (signal 60). Therefore, the transistor 6 is turned on, and the output node 4 is maintained at the level of the power supply potential Vss (signal 40).

When the signal applied to the input node 3 rises to a H level, the output signal of the inverter circuit 13 falls to a L level. Therefore, the transistor 9 is turned off, and the transistor 16 is turned on.

Also, the output signal from the inverter circuit 13 falls to a L level, whereby transistors 10 and 11 are turned on and off, respectively, and transistors 17 and 18 are turned on and off, respectively.

The transistor 6 has the potential of the control electrode node 6a (signal 61) discharged by the transistor 16 to attain the level of ground potential, and enters an OFF state.

The output of the delay circuit 33 maintains the state of the L level on account of its relatively great delay time, and the transistor 12 attains an off state. Under this state, the other electrode 7b of the capacitor 7 which was attaining the level of power supply potential Vdd and the other electrode 8a of the capacitor 8 which was attaining the ground potential level are connected. The control electrode node 5a is connected to capacitors 7 and 8 under the high impedance state. The other electrode 7b of the capacitor 7 and the other electrode 8a of the capacitor 8 attain the level of power supply potential Vdd and the ground potential Vss, respectively. Therefore, the connection of capacitors 7 and 8 to the control electrode node 5a causes transfer of charges, whereby the potential of the control electrode node 5a instantaneously changes to a potential determined by the capacitance ratio of capacitors 7 and 8 (signal 51).

The voltage (signal 52) determined by the capacitance division of capacitors 7 and 8 is smaller than the operating power supply potential Vdd supplied to the operating power supply node 1. Therefore, the potential of the control electrode node 5a becomes lower than the threshold voltage of the p channel MOS transistor 5, whereby the transistor 5 conducts. The transistor 5 supplies a predetermined drain current according to the voltage applied to the control electrode node 5a. The potential of the output node 4 slowly rises according to a constant drain current supplied from the transistor 5. The voltage of the control electrode node 5a of the transistor 5 determined according to the conduction of charges (principle of conservation of charges) in capacitors 7 and 8 instantaneously achieves a settled state, so that there is no delay in the response initiation as compared to the case where the gate voltage is slowly changed using a capacitor. More specifically, the potential of the output node 4 (signal 41) begins to rise slowly at a timing substantially equal to the rise of the signal in the input node 3 to a H level.

The drain current supplied from the transistor 5 to the output node 4 is determined by the voltage of the control electrode node 5a. The voltage of the control electrode node 5a is determined by the ratio of the capacitances of the capacitor 7 to the capacitor 8. The potential change speed of the output node can be set to a desired value by modifying the capacitance ratio of capacitors 7 and 8. If a desired voltage changing speed is not obtained after the buffer circuit has been integrated, laser trimming technique and the like can be used to easily adjust the value during the testing process after manufacturing. Alternatively, an external capacitor may be provided. The potential changing speed of an output node can be set easily and correctly, as compared to the case of a structure that drives the output node slowly using a buffer circuit of a small driving capability.

Figure 22:
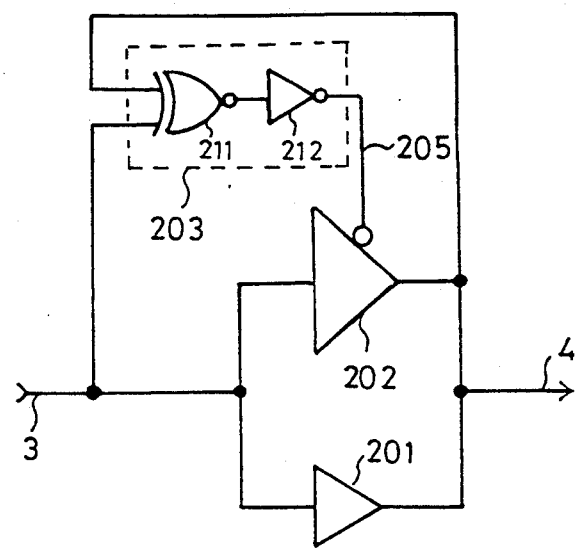
FIG. 22 shows another structure of a conventional output buffer circuit.
Figure 23:
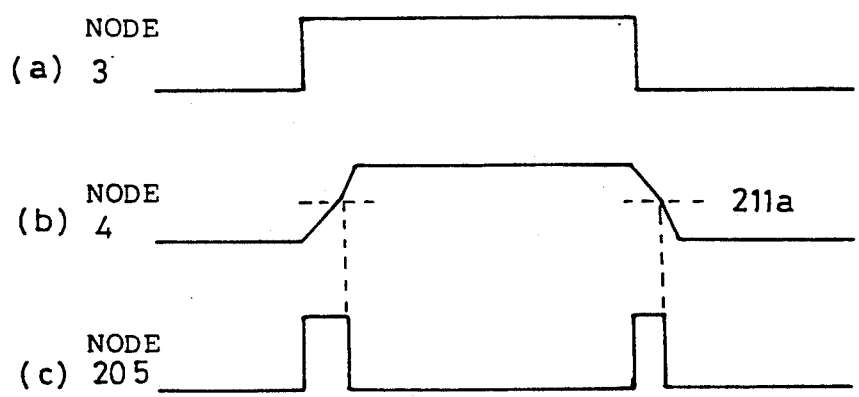
FIG. 23 is a signal waveform diagram showing an operation of the output buffer circuit of FIG. 22.

In the structure of determining the driving capability for an output node according to the transistor size (the structure of FIG. 22), there is a possibility that the desired output changing characteristics can not be obtained because of deviation in transistor size caused by difference in the manufacturing parameters on account of offset in mask positioning or mask misalignment during the manufacturing process or the like. Conventionally, it is substantially impossible to adjust the transistor size after manufacturing. However, in the case of the present embodiment where the voltage changing speed is determined using the capacitance ratio of the capacitors, the capacitance ratio can be easily adjusted during the testing process. These capacitors can also be "externally provided".

Because a relative value of the ratio of capacitance is used as a parameter, there will be no deviation in the ratio even if an offset in mask positioning occurs during the manufacturing process because both will receive the same deviation. Therefore, a desired output voltage changing characteristics can be obtained correctly.

The transistor 6 has the potential of the control electrode node 6a discharged to the ground node 2 via the transistor 16. Therefore, the transistor 6 is turned off speedily, so that the generation of a through-current from the power supply node 1 to the ground node 2 can be reliably prevented by means of transistors 5 and 6.

The potential of the control electrode node 5a determined by the capacitance ratio of capacitors 7 and 8 maintains its potential level for some time because transistors 9 and 11 and transistor 19 connected thereto are all turned off (signal 52).

Figure 2:
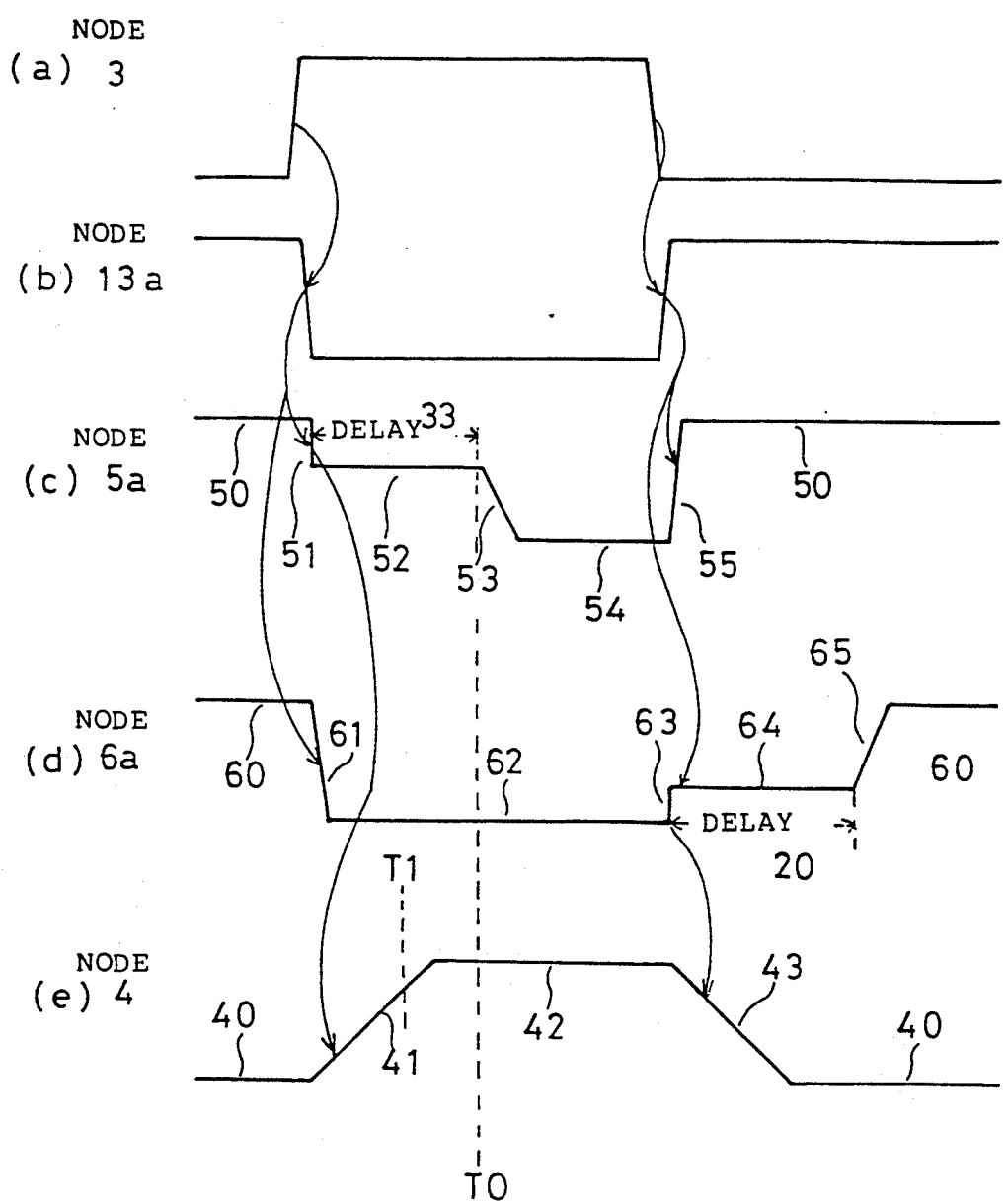
FIG. 2 is a signal waveform diagram showing an operation of the buffer circuit of FIG. 1.

Because the transistor 5 carries out a constant current operation of conducting a desired drain current flow according to the potential shown by signal 52 in FIG. 2, the signal of the output node 4 rises at a constant rate. There will be no abrupt potential change in the output node 4, so that the generation of noise can be prevented reliably. This state continues until the output of the delay circuit 33 reaches an H level.

When a predetermined delay time elapses and the output of the delay circuit 33 attains a H level, the transistor 12 is turned on to discharge the potential of the control electrode node 5a to the level of ground potential Vss (signal 53). At this state, the output node 4 already attains the H level, and the transistor 5 enters nonsaturated state and sufficiently attains an ON state, whereby the output node 4 is maintained at the H level in stabilization by its great driving capability (signal 54).

The supply current Ids of the MOS transistor is expressed as follows:

1 When $|Vds| < |Vgs - |Vth||$,
 $Ids = K \{2 (Vgs - |Vth|) Vds - Vds\}$, and
 when $|Vds| \geq |Vgs - |Vth||$,
 $Ids = K (Vgs - Vth|)^2$,
where Vgs is gate-source voltage, Vds drain-source voltage, and Vth threshold voltage.

The operation of the signal of the input node 3 changing from the H level to the L level will be described.

When the signal of the input node 3 attains a H level, transistors 9 and 16 are turned off and on, respectively. Because the output of the delay circuit 20 is at a H level (delay circuit 20 and delay circuit 33 have substantially the same delay time), the transistor 19 attains an OFF state. The output signal of the inverter circuit 13 attains a L level, whereby transistors 10 and 17 are ON, and transistors 11 and 18 are OFF.

When the signal of the input node 3 falls to the L level, the transistors 9 and 16 are turned on and off, respectively. This causes the potential of the control electrode node 5a to be pulled up at a high speed to the level of the power supply potential Vdd by the transistor 9 (signal 55). The transistor 5 is turned off speedily.

Meanwhile, the output of the delay circuit 20 still attains the H level. However, when the output signal from the inverter circuit 13 rises to a H level, transistors 18 and 17 are turned on and off, respectively. The transistor 16 already attains the OFF state. Therefore, because transistors 16 and 19 are both turned off, the control electrode node 6a rapidly changes to a potential determined by the capacitance ratio of capacitors 14 and 15 (signal 63).

In other words, the other electrode 14a of the capacitor 14 which was coupled to the power supply node 1 by the transistor 17 is connected via the transistor 18 to the other electrode 15b of the capacitor 15 which was coupled to the ground node 2 by the transistor 16. The control electrode node 6a attains a high impedance state to instantaneously receive a voltage determined by the capacitance ratio of capacitors 14 and 15 according to the principle of conservation of charges of capacitors 14 and 15. The transistor 6 is turned on in response to the rise of the potential of the control electrode node 6a. The potential level of the control electrode node 6a (signal 64) drives the transistor 6 in a saturation state, whereby the transistor 6 carries out a constant current operation according to the voltage applied to the control electrode node 6a to discharge a constant drain current to the ground node 2. Thus, the potential of the H level of the output node 4 slowly falls (signal 43).

When a predetermined delay time elapses, i.e. when the potential of the output node 4 reaches the L level, the output of the delay circuit 20 falls to the L level and the transistor 19 is turned on. This causes the control electrode node 6a to be coupled to the power supply node 1, whereby the potential thereof rises to the level of the power supply potential Vdd (signal 65). As a result, the transistor 6 attains a deep ON state, to maintain the output node 4 at the L level of ground potential Vss in stabilization with the great driving capability. This state continues until the level of the signal applied to the input node 3 changes or until the circuit operation terminates (disconnection of the power source) (signals 60 and 50).

Because the transistor 5 already attains an OFF state at the time of the discharging operation of the output node 4, current will not flow from the power supply node 1 to the ground node 2 to reduce the current consumption. Furthermore, the potential of the control electrode node 6a determined by capacitors 14 and 15 can be maintained at a desired voltage level in a substantially constant state (signal 64) because a leakage path of charges does not exist when transistors 16, 17 and 19 are turned off, so that the transistor 6 can carry out a constant current operation in stabilization. As a result, the potential of the output node 4 slowly changes to prevent generation of noise.

In the above description, the delay times of delay circuits 20 and 33 are set to be longer than the time required for the potential of the output node 4 to attain a H level (signal 42) or a L level (signal 40). However, the delay times of delay circuits 20 and 33 may be set so that the output of the delay circuit 33 changes at time T1 before the potential of the output node 4 completely reaches the H level, as shown at time T1 in FIG. 2, or so that the output of the delay circuit 20 changes before the potential of the output node 4 reaches the L level. In other words, the present embodiment may be modified so that transistors 5 and 6 of great driving capabilities supply a maximum drain current flow when the potential of the output node 4 reaches a predetermined potential level.

The potential change of the control electrode node in the buffer circuit of FIG. 1 will be described now.

Figure 3:
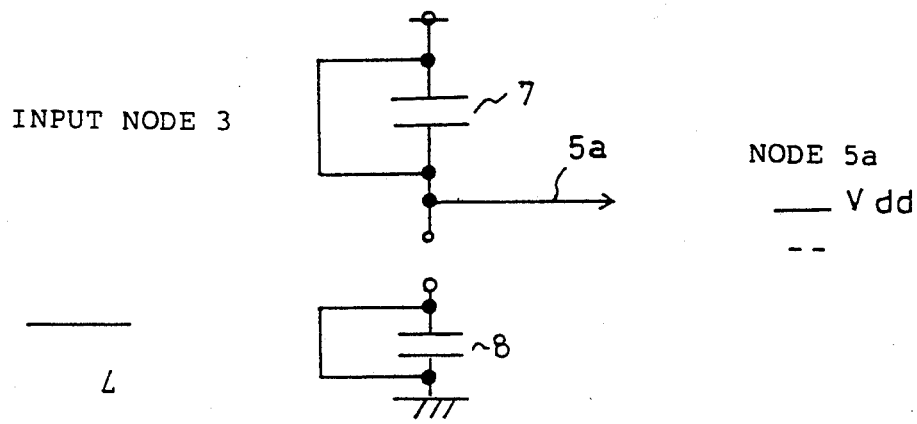
FIG. 3 is a diagram for describing the control electrode voltage determining operation of an output-node-pull-up transistor in the buffer circuit of FIG. 1.

FIG. 3 shows the states of capacitors 7 and 8 when the potential of the input node 3 attains a L level. As shown in FIG. 3, capacitors 7 and 8 are shorted, and the control electrode node 5a attains a level of the power supply potential Vdd when the potential of the input node 3 is at the initial state of the L level.

Figure 4:
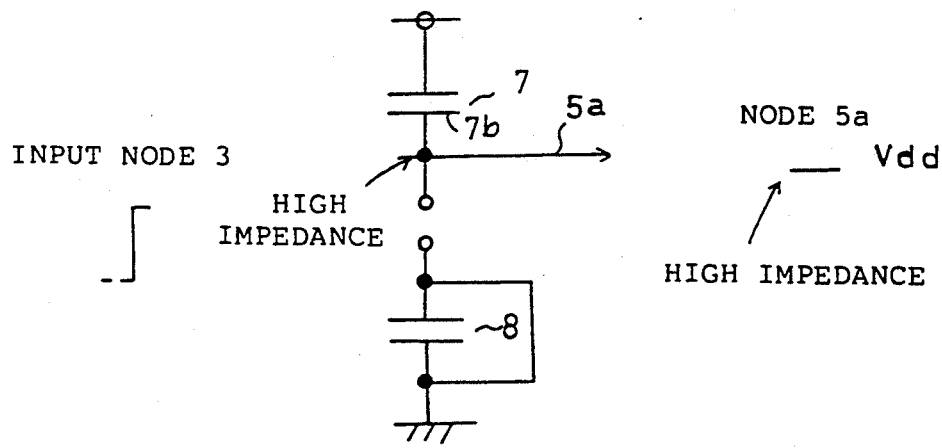
FIGS. 4 to 6 are diagrams for describing the operation of the capacitor divider circuit for determining control electrode voltage of the output-pull-up transistor of the buffer circuit of FIG. 1.

FIG. 4 shows the states of capacitors 7 and 8 when the potential of the signal applied to the input node 3 rises from the L level to the H level. As shown in FIG. 4, the capacitor 7 is released from the shorted state under this state. The capacitor 8 is still shorted on 5 of the delay of the inverter circuit 13. At this account state, the control electrode node 5a attains a high impedance state, and charges held in electrode 7b of the capacitor 7 are maintained.

Figure 5:
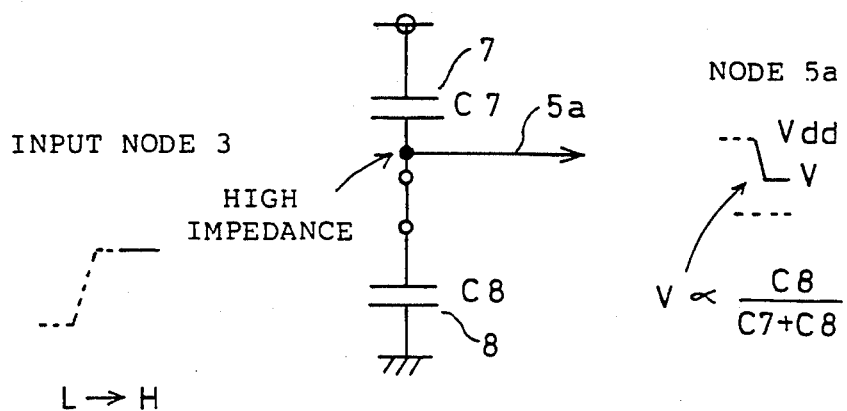

FIG. 5 shows the states of capacitors 7 and 8 after a time period from the rise of the signal of the input node 3 to the H level. In this state, the signal of the inverter circuit 13 falls to the L level, whereby the capacitor 8 is released from the shorted state to be connected to the control electrode node 5a. The control electrode node 5a already attains a high impedance state. Therefore, the charges in the capacitor move to the capacitor 8. By the principle of conservation of charges, the voltage V of the control electrode node 5a measures a value determined by the ratio of capacitances C7 and C8 of capacitors 7 and 8, i.e., $V = C8 \cdot Vdd/(C7+C8)$. The potential change of the control electrode node 5a from the power supply potential Vdd to potential V is carried out only by the transfer of the charges with the control electrode node 5a attaining a high impedance state, so that the potential of the control electrode node 5a is instantaneously decided.

Figure 6:
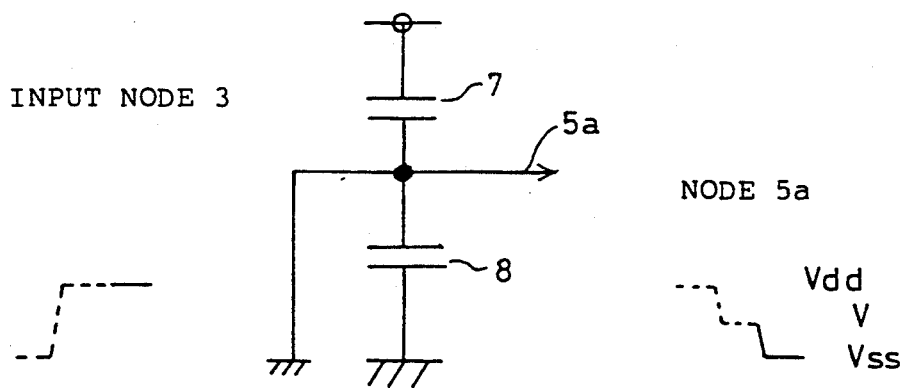

FIG. 6 shows the state after the delay time of the delay circuit 33 elapses from the rise of the potential of the input node 3 to the H level. At this state, the control electrode node 5a is coupled to ground potential Vss, whereby the charges of the capacitor 8 are discharged so that the potential of the control electrode node 5a falls speedily to the level of ground potential Vss.

As described above, the potential change of the control electrode node 5a occurs substantially instantaneously by connecting capacitors 7 and 8 with the control electrode node 5a attaining a high impedance state. Therefore, the output transistor 5 immediately begins to drive the output node 4 in response to the signal potential change in the input node 3, so that there is no delay in response characteristics, resulting in implementation of a buffer circuit of high speed response characteristics.

Figure 7:
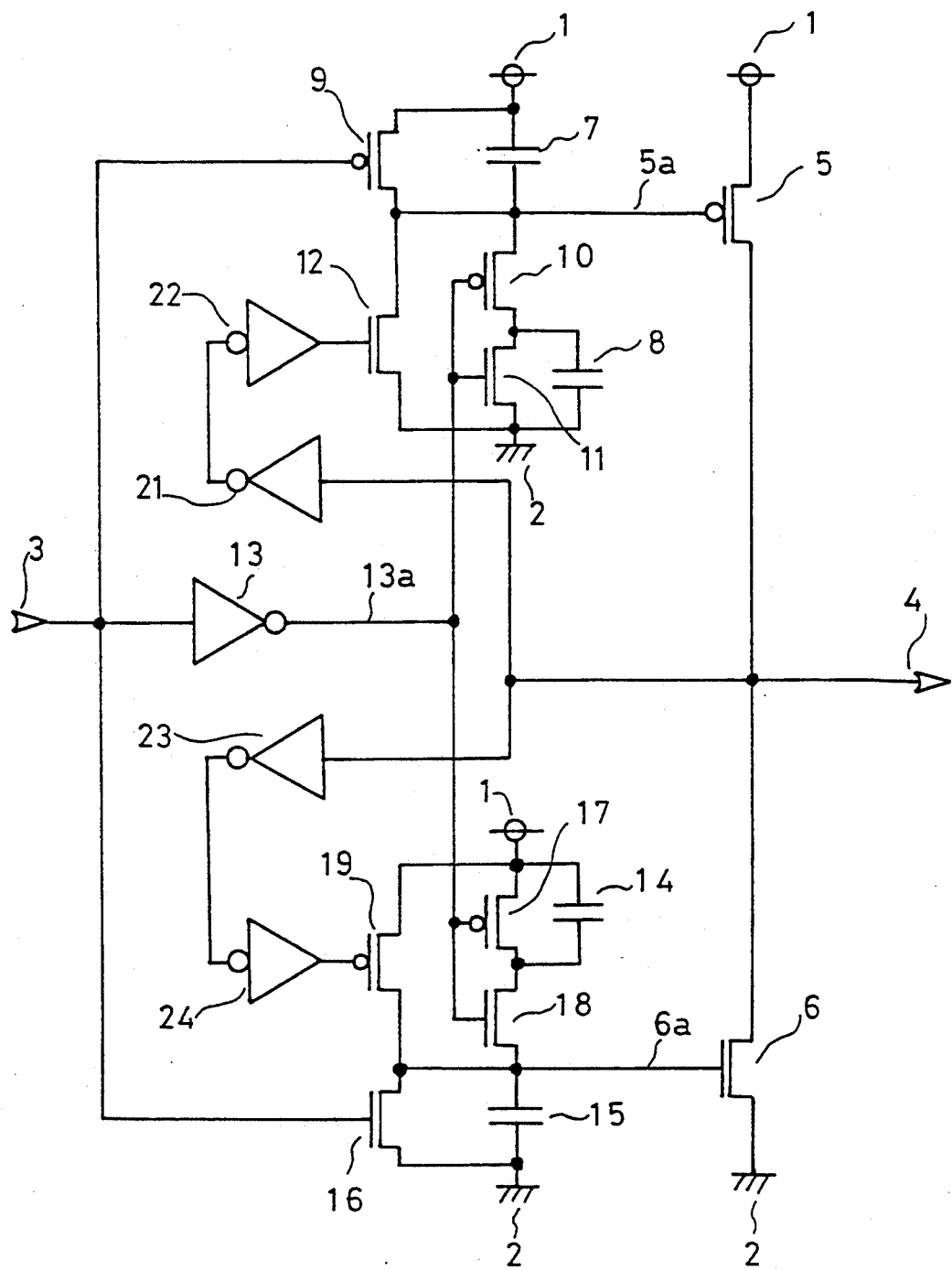
FIG. 7 shows a structure of a buffer circuit according to a second embodiment of the present invention.

FIG. 7 shows a structure of a buffer circuit according to a second embodiment of the present invention. The buffer circuit of FIG. 7 has a structure substantially similar to that of the circuit shown in FIG. 1, except that inverter circuits 21 and 22 responsive to the potential on the output node 4 for driving the transistor 12, and inverters circuits 23 and 24 responsive to the potential of the output node 4 for driving the transistor 19 are provided instead of delay circuits 33 and 20 driving transistors 12 and 19, respectively. The input threshold voltage of the inverter circuit 21 is set to a high value, and the threshold voltage of the inverter circuit 23 is set to a low value. Setting an input logic threshold voltage of the inverter circuit can be realized by adjusting the threshold voltage of each MOS transistor or the transistor size in the case the inverter circuit is implemented with a CMOS structure. For example, the input threshold voltage of the inverter circuit 21 can be increased by setting the threshold voltage of the n channel MOS transistor to a high value or the transistor size of the p channel MOS transistor to a great value when the inverter circuit is formed of a CMOS transistor. The adjustment of the threshold voltage can be set to a desired value by implanting impurities into the channel region of the MOS transistor. The other components of the buffer circuit of FIG. 7 are similar to those of the buffer circuit of FIG. 1. In the buffer circuit of FIG. 1, transistors 5 and 6 are driven to a deep ON state when a predetermined time elapses regardless of the actual potential level of the output node 4. The buffer circuit of FIG. 7 drives transistors 5 and 6 to an ON state according to the potential level of the output node 4. The operation of the buffer circuit of FIG. 7 will be described with reference to FIG. 8 which is an operation waveform diagram thereof.

The state from the rise of the potential of the input node 3 from the L level to the H level until the potential of the control electrode node 5a is determined by the capacitance division of capacitors 7 and 8 is similar to that described in the operation of the buffer circuit with reference to FIGS. 1 and 2.

When the potential of the output node 4 attains a predetermined potential level, i.e. becomes higher than the input logic threshold value 21a of the inverter circuit 21, the outputs of the inverter circuits 21 and 22 attain an L level and an H level, respectively. This turns on the transistor 12, whereby the potential of the control electrode node 5a falls to the ground potential Vss (signal 53). As a result, the transistor 5 drives the output node 4 with the maximum drain current. The potential of the output node 4 is raised speedily to the H level, which is stably maintained by the high driving capability of the transistor 5.

The operation of the potential of the input node 3 falling to the L level from the H level will now be described. The operation of the transistor 5 being turned off, and the potential of the control electrode node 6a of the transistor 6 instantly changing to the potential determined by the capacitance division of capacitors 14 and 15 are similar to those of the buffer circuit already described with reference to FIGS. 1 and 2. By the potential of the control electrode node 6a, the transistor 6 is driven at a weak ON state to discharge the potential of the output node 4 slowly (signal 43). When the potential of the output node 4 becomes lower than a predetermined potential, i.e. lower than the input logic threshold value 23a of the inverter circuit 23, the outputs of inverter circuits 23 and 24 attain a H level and a L level, respectively. In response, the transistor 19 is turned on, whereby the control electrode node 6a is charged to the power supply potential Vdd. As a result, the transistor 6 is driven under an sufficient ON state, whereby the output node 4 is discharged at a high speed to set the potential thereof to a L level. The L level of the output node 4 is maintained in stabilization by the high driving capability of the transistor 6.

Figure 8:
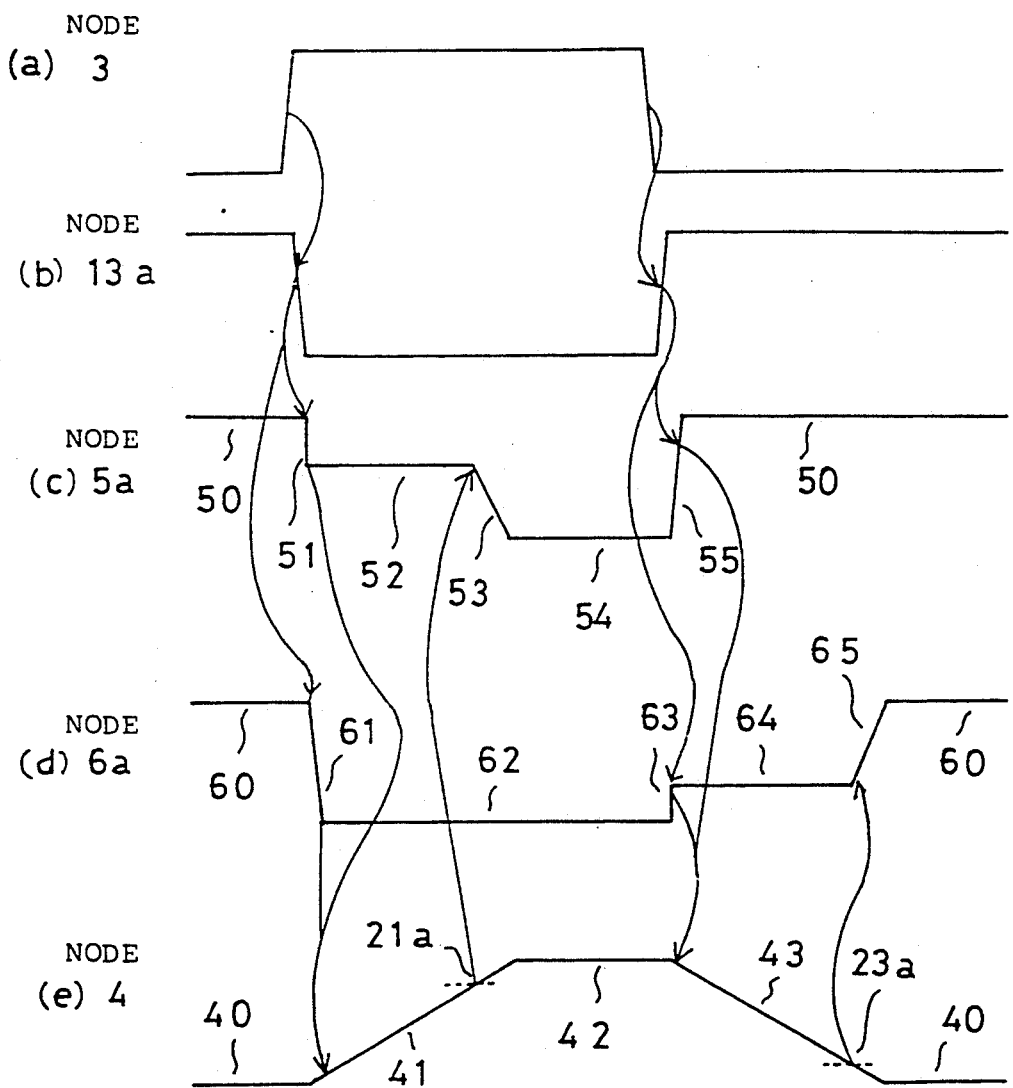
FIG. 8 is a signal waveform diagram for showing the operation of the buffer circuit of FIG. 7.

According to the structure of the buffer circuit shown in FIGS. 7 and 8, the transition timing into high driving capability of transistors 5 and 6 can be easily set precisely, even when the capacitance ratio of capacitors 7 and 8 and that of capacitors 14 and 15 are changed to modify the potential changing speed of the output node 4.

More specifically, when the capacitance values of capacitors 8, 7, 14 and 15, and the potential changing speed of the output node 4 are modified depending upon the application service, transistors 5 and 6 may make a transition to a high driving capability state after a predetermined time period regardless of the actual level of the potential of the output node 4 in the case of the buffer circuit of FIG. 1. Therefore, there is a concern of the potential level of the output node 4 becoming slightly unstable.

However, according to the structure shown in FIG. 7 where the potential of the output node 4 is detected and the transistors 5 and 6 are brought to a high driving capability state according to the detected potential level, transistors 5 and 6 can be reliably driven to a high driving capability state at a desired timing, so that the potential of the output node 4 can be changed in stabilization and reliably held at a stable state.

Figure 9:
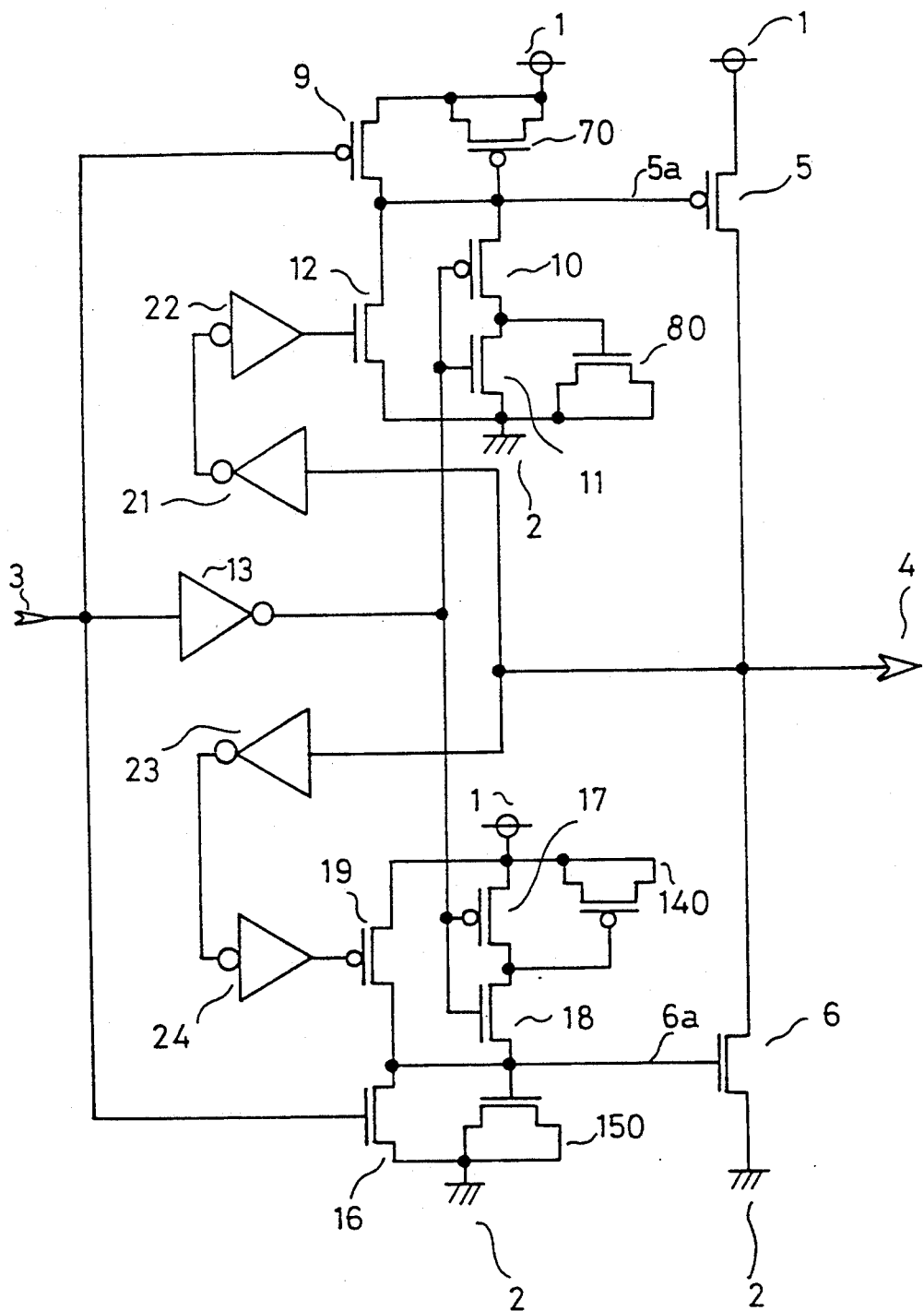
FIG. 9 shows a structure of a buffer circuit according to a third embodiment of the present invention.

FIG. 9 shows a structure of a buffer circuit according a third embodiment of the present invention. The buffer circuit of FIG. 9 has a structure similar to that of the buffer circuit of FIG. 7 except that capacitors 7, 8, 14 and 15 are substituted by MOS type capacitors 70, 80, 140 and 150. Therefore, the operation of the buffer circuit of FIG. 9 is similar to that of FIG. 7, and their description will not be repeated.

In the buffer circuits of FIGS. 1 and 7, the capacitor may be externally provided using a discrete device, or may be formed in the same process of other transistor devices in the semiconductor integrated circuit device. When the capacitor is externally provided, a desired output node potential changing characteristics can easily be obtained.

Figure 10:
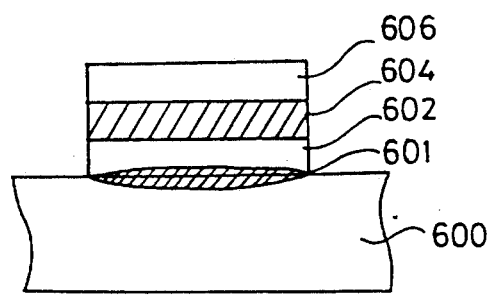
FIG. 10 is a sectional diagram of a capacitor forming a capacitor divider circuit.

There was a problem of a large occupying area of the capacitor when the capacitor and the transistor are formed in the same manufacturing process in a semiconductor integrated circuit device. More specifically, as shown in FIG. 10, a capacitor in an integrated circuit device includes an interconnection layer 602 serving as one electrode formed on an interlayer insulation film (or element isolation insulation film) 601 on a semiconductor substrate 600, an insulation film 604 formed on the interconnection layer 602, and an interconnection layer 606 serving as the other electrode formed on the interlayer insulation film 604. Interconnection layers 601 and 606 are normally formed of an interconnection layer having a level identical to that of the interconnection layer formed in transistor manufacturing in a semiconductor integrated circuit device. In this case, the interlayer insulation film 604 between the interconnection layers 601 and 606 is relatively thick. Therefore, the occupying area of the capacitor must be increased to obtain a desired capacitance. If a MOS type capacitor is used as this capacitor, the occupying area of the device can be reduced.

Figure 11:
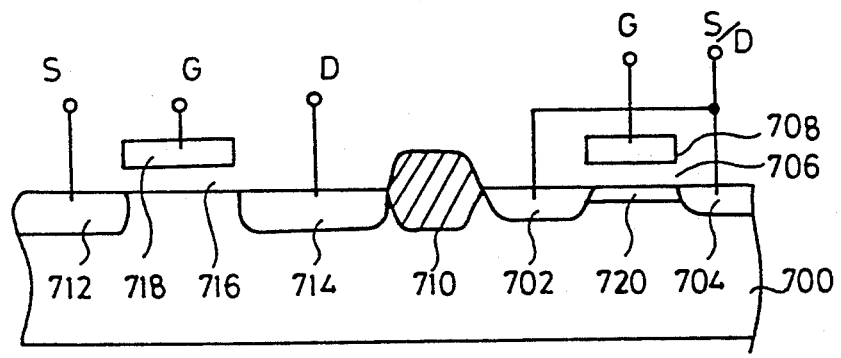
FIG. 11 is a sectional diagram of the capacitor of FIG. 9.

More specifically, a MOS type capacitor of FIG. 11 includes impurity regions 702 and 704 formed on the surface of a semiconductor substrate or a well region 700, and a gate electrode layer 708 formed on the channel region 720 between impurity regions 702 and 704 with a gate insulating film 706 therebeneath. Impurity regions 702 and 704 are commonly connected to form one electrode of the MOS capacitor. The gate electrode layer 708 forms the other electrode of the MOS type capacitor. The gate insulation film 706 is significantly thinner than the interlayer insulation film 604 of FIG. 10. Therefore, a capacitor of a sufficient capacitance can be realized with a small occupying area. In operation, the MOS type capacitor has an inversion layer formed in the channel region 720, whereby impurity regions 702 and 704 are electrically connected to form one electrode of the capacitor. Therefore, when a MOS type capacitor is used as a capacitor for determining the potential of the control electrode node of output transistors 5 and 6, the occupying area is reduced significantly. Such a MOS type capacitor is very effective in applying the output buffer circuit in a semiconductor integrated circuit device of high integration and high density.

The buffer circuit of FIG. 9 has a MOS type capacitor using a p channel MOS transistor arranged in the proximity of the p channel MOS transistor, and a MOS type capacitor using an n channel MOS transistor formed adjacent to the n channel MOS transistor. In a normal CMOS configuration, the p channel MOS transistor is arranged at the side of the power supply, and the n channel MOS transistor is arranged at the side of ground. Therefore, the layout of a semiconductor integrated circuit device is facilitated. More specifically, referring to FIG. 11, one MOS transistor is formed by impurity regions 712 and 714, a gate insulation film 716, and a gate electrode layer 718 in the same semiconductor substrate or well region. If this MOS transistor is a p channel MOS transistor, it will be arranged at a position in the proximity of the power supply node 1. Therefore, the layout is facilitated by forming a MOS capacitor adjacently in the same well region using a MOS transistor of the same conductivity type.

However, a p channel MOS transistor and an n channel MOS transistor may be used at the sides of ground and power supply, respectively, as a capacitor. In this case, another well region or another impurity region may be required for isolation of a MOS type capacitor from adjacent transistors, which may be a disadvantage in layout. However, the operation of the buffer circuit is not affected. Furthermore, it is not only possible to implement a capacitor with a p channel MOS transistor and an n channel MOS transistor, but with only an n channel MOS transistor or a P channel MOS transistor. In this case, the ratio of the capacitance can be set precisely to obtain a more acute desired potential changing speed because the capacitors connected in series are formed using MOS transistors of the same conductivity type.

Figure 12:
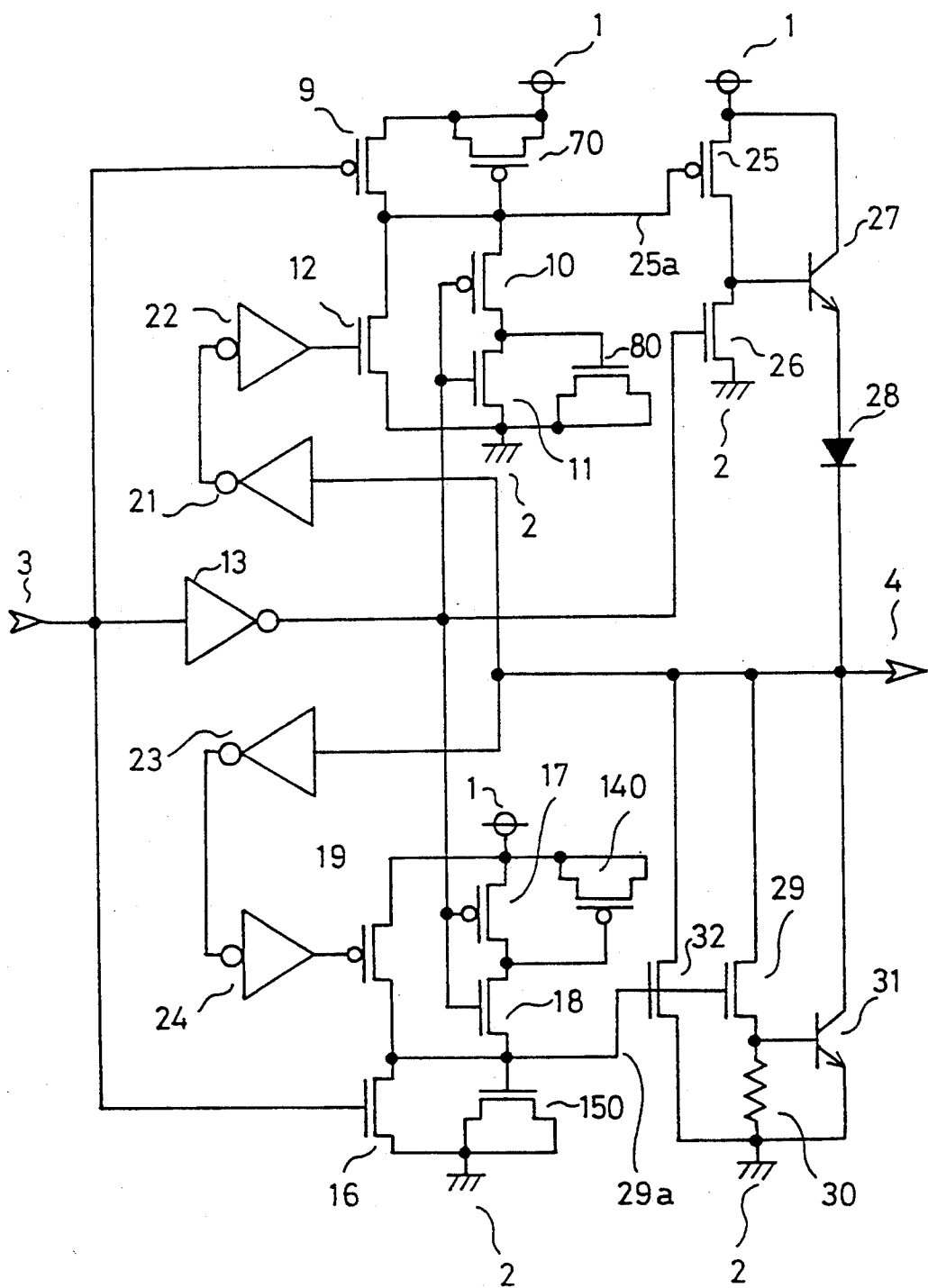
FIG. 12 shows a structure of a buffer circuit according to a fourth embodiment of the present invention.

FIG. 12 shows a structure of a buffer circuit according to a fourth embodiment of the present invention. The buffer circuits shown in FIGS. 1, 7, and 9 are all CMOS buffer circuits. The buffer circuit of FIG. 12 is a BiCMOS buffer circuit including a bipolar type transistor at the output stage. A bipolar type transistor has a driving capability higher than that of a MOS transistor. In general, there is a possibility of noise generation on account of its high driving capability when an output node is driven using a bipolar type transistor at the output stage. However, according to the BiCMOS buffer circuit of the present invention, a buffer circuit can be obtained that operates in a stable manner having high speed response characteristics without generating noise and gate delay.

Referring to FIG. 12, the buffer circuit includes at the output stage a p channel MOS transistor 25 responsive to the voltage supplied to the control electrode node 25a for transmitting voltage/current from the power supply node 1, an npn bipolar transistor 27 responsive to the output of the transistor 25 for driving the output node 4 to a H level, a diode 28 for shifting the level of the output potential of the npn bipolar transistor 27, and an n channel MOS transistor 26 responsive to the output signal from the inverter circuit 13 for drawing out speedily the base stored charges of the bipolar transistor 27.

The diode 28 is provided for the purpose of adjusting the output level to the TTL level of the interface of an external circuit connected to the output node 4. The bipolar transistor includes a base-emitter voltage drop Vbe. Therefore, the H level of the output node 4 is Vdd−Vbe−Vf, where Vf is the forward voltage drop of the diode 28. The diode 28 may be formed of a pn junction diode or a Shottkey diode.

The buffer circuit of FIG. 12 further includes an n channel MOS transistor 29 responsive to the signal voltage provided to the control electrode node 29a for transmitting voltage/current from the output node 4, an npn bipolar transistor 31 responsive to the output of the transistor 29 for discharging the output node 4 to ground potential Vss, an n channel MOS transistor 32 responsive to the potential of the signal applied to the control electrode node 29a for reliably discharging the output node 4 to ground potential Vss, and a resistor element 30 provided between the base of the bipolar transistor 31 and the ground node 2. The resistor element 30 is provide for the purpose of applying base-emitter bias to the bipolar transistor 31. As described before, the bipolar transistor 31 includes base-emitter voltage drop Vbe. Therefore, the bipolar transistor 31 will discharge the output node 4 only down to the level of Vbe. The n channel MOS transistor 32 is provided for the purpose of discharging the potential Vbe of the output node 4 eventually to the level of ground potential Vss. The remaining structure is similar to that of the buffer circuit of FIG. 9.

Now, the operation thereof will be described briefly. When the potential of the input signal of the input node 3 rises from the L level to the H level, the transistor 26 is turned off. The control electrode node 25a of the transistor 25 has its potential changed according to the capacitance ratio of capacitors 70 and 80. The transistor 25 responds to the voltage applied to the control electrode node 25a to conduct and supply drain current to the base of the bipolar transistor 27. When the base potential of the bipolar transistor 27 rises and the base current is supplied via the transistor 25, the transistor 27 is turned on, whereby the output node 4 is driven at a high speed to have its potential level raised.

The control electrode potential of the transistor 25 is at an intermediate potential, and the potential transmitted from the control electrode node 25a to the base of the bipolar transistor 27 is lower than the power supply potential Vdd level (the MOS transistor causes a voltage drop of the threshold voltage Vth). Therefore, bipolar transistor 27 has its great current driving capability limited, whereby the output node 4 rises slowly.

When the potential of the output node 4 exceeds a predetermined value (the input logic threshold of the inverter circuit 21), the transistor 12 is turned on and transistor 25 attains a complete ON state. This causes the base potential of the bipolar transistor 27 to attain the level of the power supply potential Vdd, whereby the bipolar transistor 27 drives the output node 4 with its maximum collector current. As a result, the output node 4 is driven by a high driving capability to be held at the H level in a stable manner.

The operation of the potential of the input node 3 falling from the H level to the L level will be described briefly. At this time, transistors 16 and 19 are turned off. The control electrode node 29a of the MOS transistor 29 transits instantaneously to a potential level determined by the capacitance values of capacitors 140 and 150. This turns the MOS transistor 29 to a weak ON state, whereby the drain current determined by the potential of the control electrode node 29a is drawn out from the output node 4. Responsively, potential difference is developed across the resistor element 30 to bias the base and emitter of the npn bipolar transistor 31 in a forward direction, whereby the transistor 31 attains a conductive state. The base potential of the transistor 31 is at a potential level of the control electrode node 29a minus the threshold voltage of the transistor 29. As a result, the bipolar transistor 31 operates in the nonsaturation region, whereby the output node 4 is discharged slowly towards the level of ground potential Vss. Because the bipolar transistor 31 includes a base-emitter voltage clamp function, the transistor 31 is cut off when the potential of the output node 4 attains the level of the base-emitter voltage Vbe of the bipolar transistor 31. The transistor 19 is already turned on by inverter circuits 23 and 24, so that the potential of the control electrode node 29a rises to the level of the power supply potential Vdd. As a result, the transistor 32 is turned on to reliably discharge the output node 4 to ground potential Vss.

In this state, the output node is driven to ground potential by the high driving capability of the transistor 32, whereby the L level of the output node 4 is maintained in a stable manner. The input logic threshold value of the inverter circuit 23 may be selected to a potential level higher than the base-emitter voltage Vbe of the bipolar transistor 31. In this case, the n channel MOS transistor 32 operates at a weak ON state before the npn bipolar transistor 31 is brought to the off state, whereby the output node 4 can be driven by the high driving capability of the transistor 32.

The transistor 26 is turned on when the signal supplied to the input node 3 falls from the H level to the L level, whereby the charges stored in the base of the npn bipolar transistor 27 are discharged at high speed towards the ground node 2. Thus, the transistor 27 is turned off at a high speed.

In the structure of the BiCMOS buffer circuit of FIG. 10, the delay in the signal change initiation of the output node 4 can be reduced.

In general, the bipolar transistor is driven after supply of the output by the MOS transistor. Therefore, it is necessary to consider gate delay by two stages of MOS transistors in transmitting a signal from the input node 3 to the output node 4. This means that the initiation of signal change at the output node is delayed in a BiCMOS circuit as compared to a CMOS buffer circuit. However, because the gate voltage of the MOS transistor for driving the output bipolar transistor is determined instantaneously by a voltage division method by capacitors as shown in FIG. 12, there is no delay in the response in the MOS transistor. Therefore, there is no delay in the on/off operation of the bipolar transistor, resulting in almost no delay in the initiation of signal change in the output node 4. Thus, a BiCMOS buffer circuit can be obtained that is superior in high speed response characteristics and of high driving capability, and that can reliably drive even a great external load.

Figure 13:
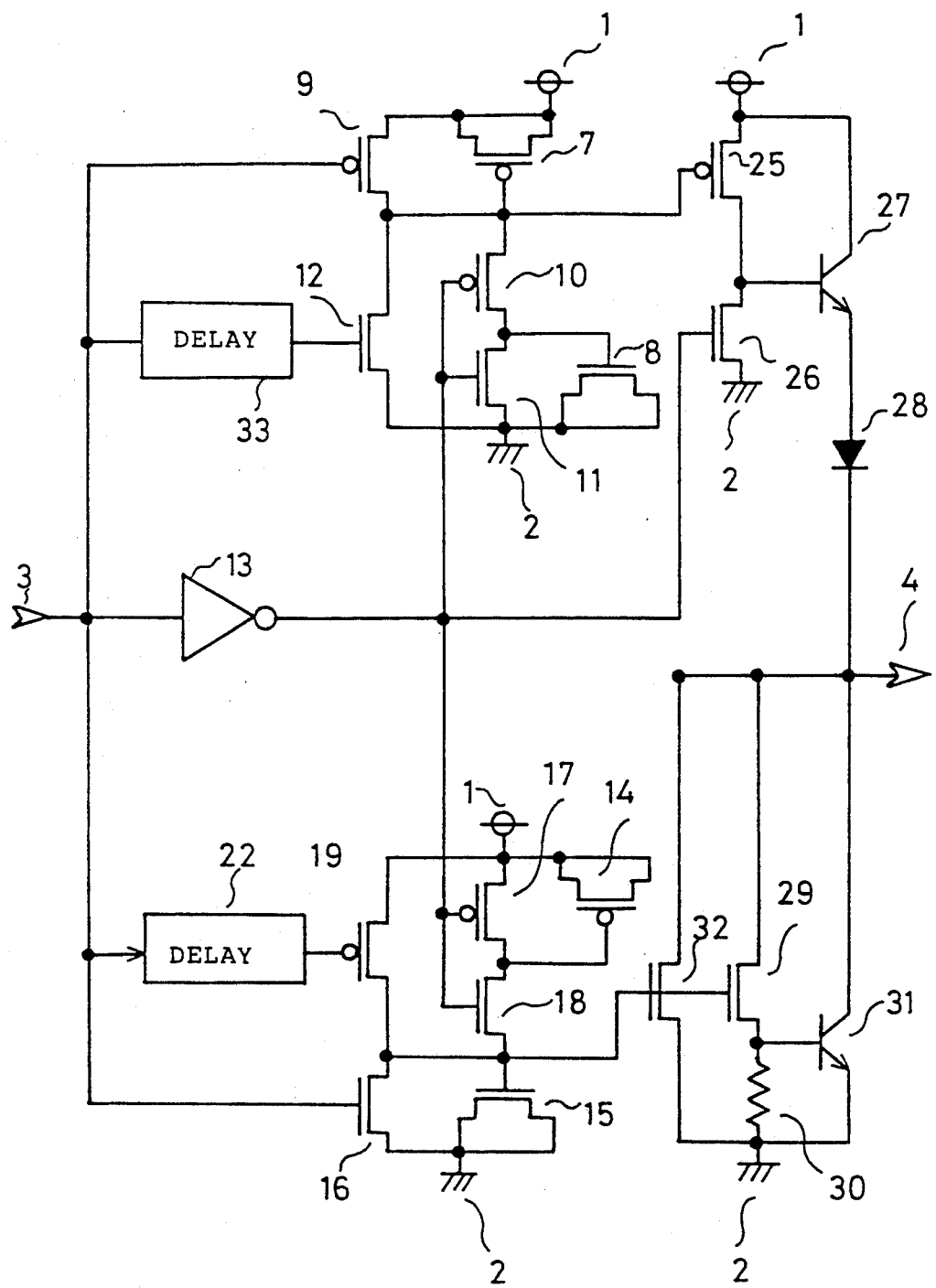
FIG. 13 shows a structure of a buffer circuit according to a fifth embodiment of the present invention.
Figure 14:
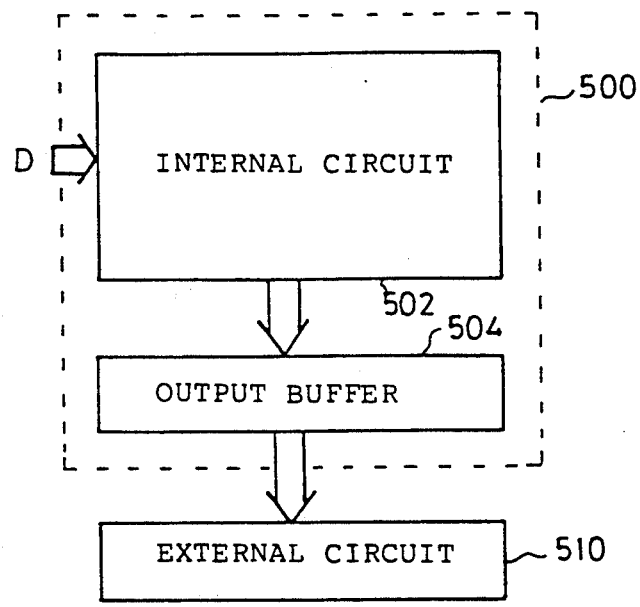
FIG. 14 shows a conventional structure of a semiconductor integrated circuit device.
Figure 15:
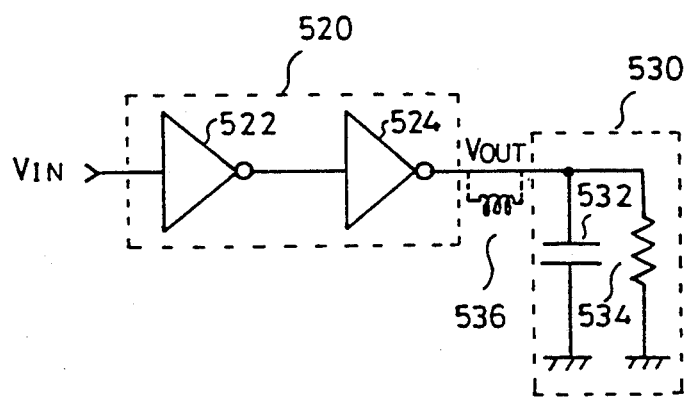
FIG. 15 shows a structure of a conventional output buffer circuit.
Figure 16:
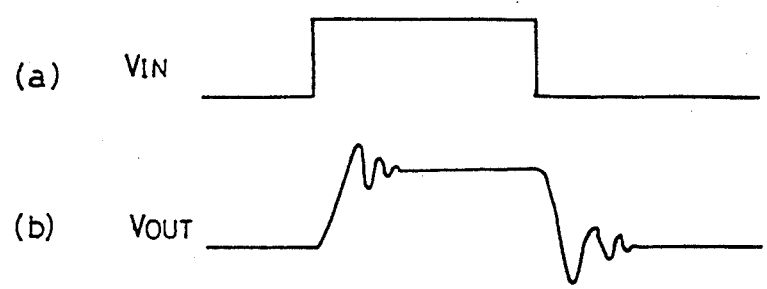
FIG. 16 is a signal waveform diagram for showing an operation of the output buffer circuit of FIG. 15.
Figure 17:
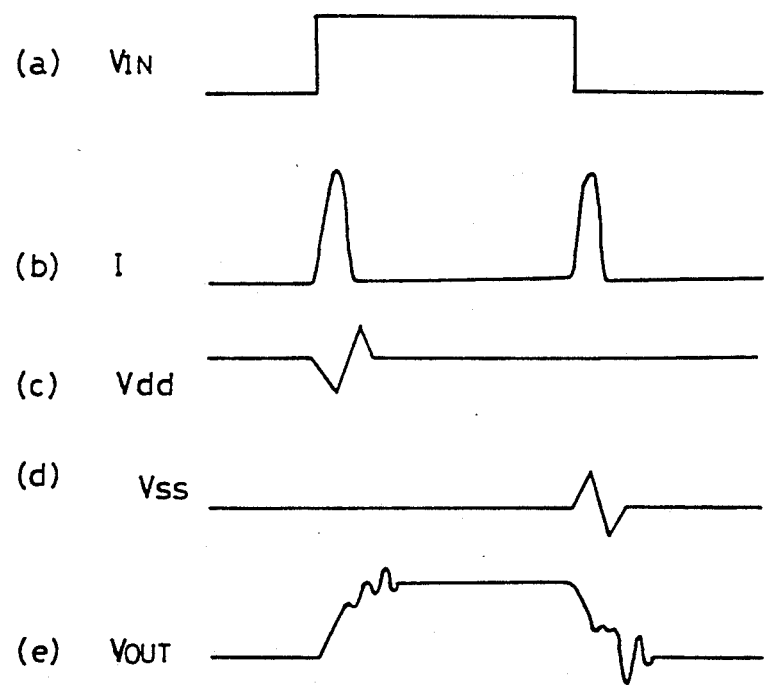
FIG. 17 is a signal waveform diagram for explaining a problem in a conventional output buffer circuit.
Figure 18:
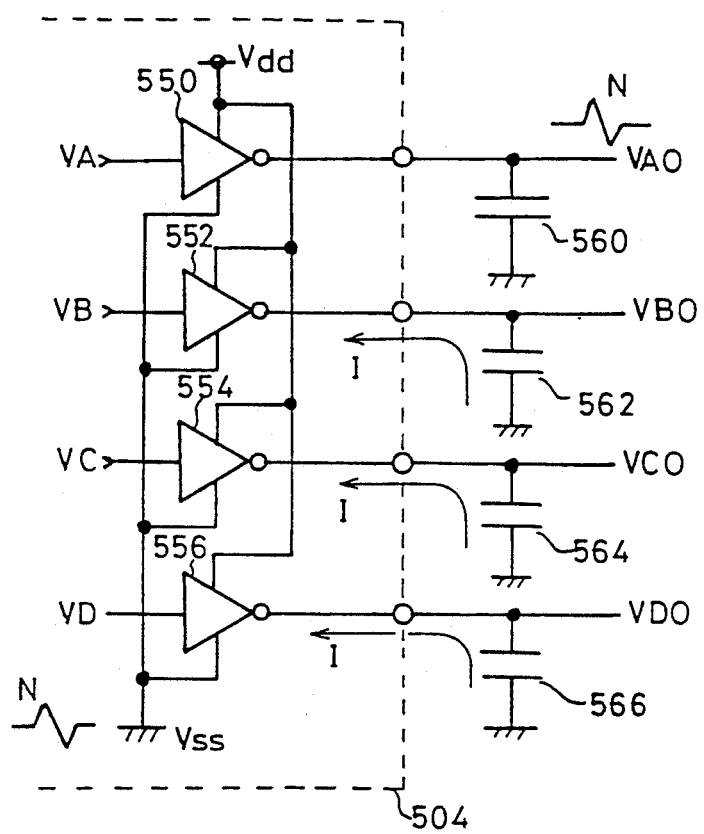
FIG. 18 shows a structure of a conventional output buffer.
Figure 19:
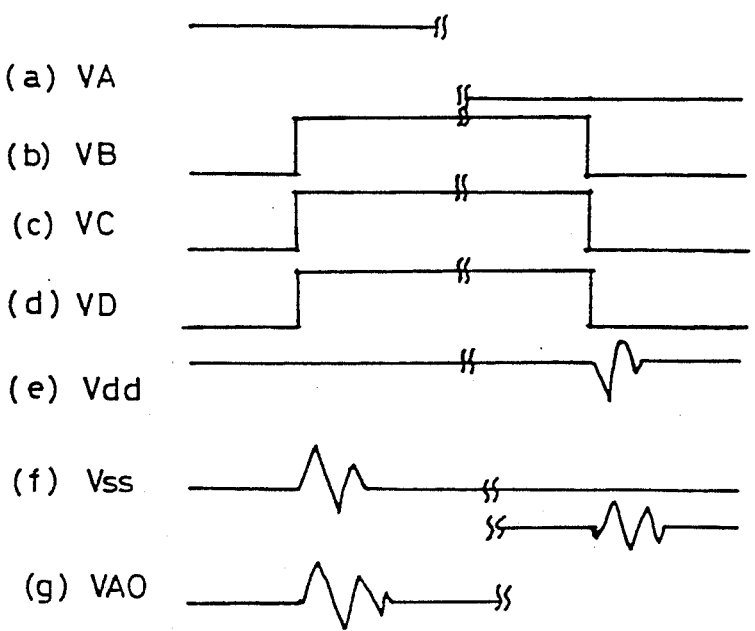
FIG. 19 is a signal waveform diagram showing an operation of the output buffer of FIG. 18.
Figure 20:
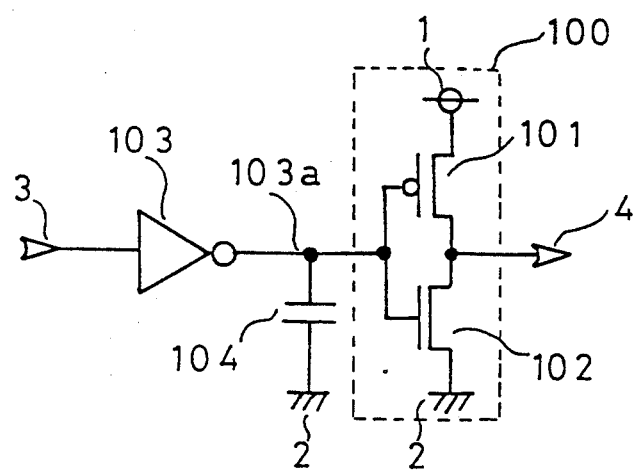
FIG. 20 shows another structure of a conventional output buffer circuit.
Figure 21:
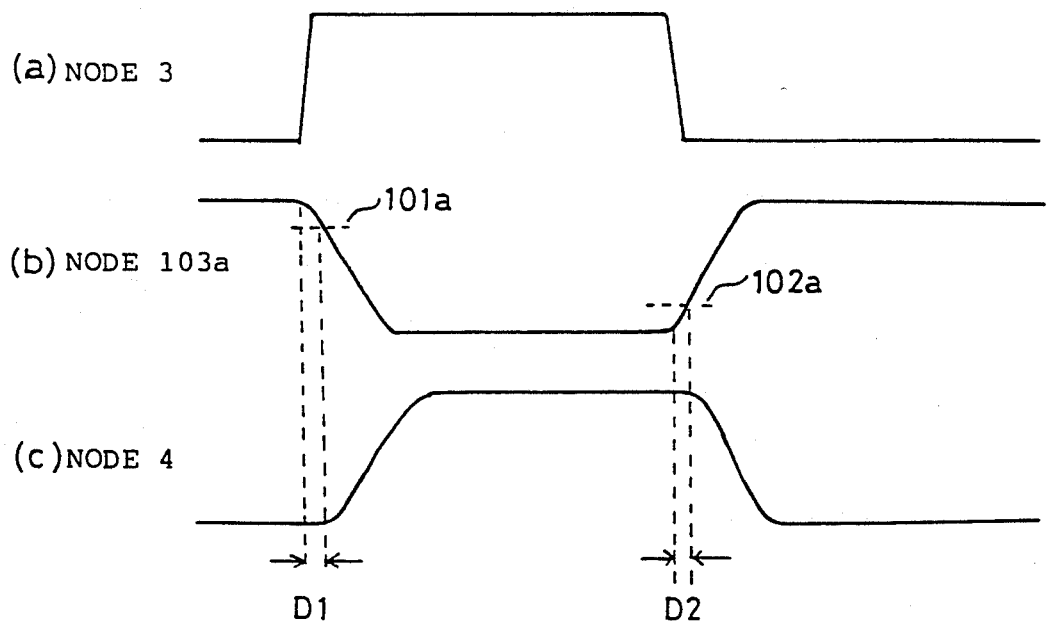
FIG. 21 is a signal waveform diagram showing an operation of the output buffer circuit of FIG. 20.

The structure shown in FIG. 12 can exhibit the effect similar to that of the above-described fourth embodiment even when applied to the structure of driving the control electrodes of output driving transistors 25 and 29 using delay circuits 22 and 33 as shown in FIG. 13.

In the buffer circuits of the above-described first to fourth embodiments, the voltage of the control electrode node of the MOS transistor is determined according to a voltage division method by capacitors in both the circuit portion of pulling up the output node to a H level, and in the circuit portion of pulling down the output node 4 to a L level. However, the structure of determining the control electrode voltage of a MOS transistor according to the capacitor voltage dividing method can provide a desired noise reduction effect even when applied to only the side of pulling up the output node, or only to the circuit portion pulling down the output node 4.

The buffer circuit of the above-described structure is not limited to an output buffer circuit for merely driving an external load, and may be the portion of driving a heavy load, for example, in a semiconductor integrated circuit device, such as a clock buffer for generating a basic operation timing signal for driving a plurality of circuits.

According to the present invention, the control electrode voltage of an output driving MOS transistor is determined and provided instantaneously by a voltage dividing circuit with capacitors to eliminate delay in the changing initiation of an output signal appearing on the output node, so that a buffer circuit can be obtained of high speed response characteristics without noise generation.

According to the present invention, the gate electrode of an output driving transistor instantaneously changes to a potential level which brings the output transistor to an OFF state when there is a change in the signal of the input node, so that the through-current in the buffer circuit can be reduced significantly.

Furthermore, because the voltage at the control electrode of the output driving transistor is determined by the capacitances of capacitors, the changing speed of the output signal can be set easily and precisely to an arbitrary value by modifying the capacitances of the capacitors.

According to the present invention, the output node is driven by only one buffer circuit, so that the circuit occupying area is greatly reduced to improve the integration density in comparison with a circuit configuration in which a three-state buffer circuit of high driving capability and a buffer circuit of low driving capability are combined.

According to the structure of setting the high driving capability transition timing of the output driving transistor according to the output potential level, it is possible to drive the output node reliably at a high driving capability according to an output potential, to obtain a buffer circuit having a desired operation characteristics in a reliable manner even when the capacitance ratio is changed.

According to the structure of driving an output bipolar transistor using a MOS transistor having the control electrode voltage determined by the voltage divider circuit with capacitors, it is possible to reliably drive the external load at a desired potential changing speed, even in the case of driving a great external load. Due to instantaneous supply of a control electrode voltage to the MOS transistor, there is no delay in the driving initiation timing of the bipolar transistor, and a buffer circuit can be obtained that operates in stabilization without noise generation and has a high speed response characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A buffer circuit comprising:
   a first potential source for supplying a potential of a first level,
   a second potential source for supplying a potential of a second level,
   an output element coupled to said first potential source and an output node, said output element having a control electrode and said output element being responsive to a signal applied to said control electrode for driving said output node to said first level,
   a first capacitive element having one electrode coupled to said first potential source and the other electrode coupled to said control electrode,
   a second capacitive element having one electrode and another electrode, said one electrode of said second capacitive element being coupled to said second potential source,
   shorting means activated in response to a signal of said second level provided to an input node for shorting said one electrode and said other electrode of said first capacitive element and shorting said first electrode and said other electrode of said second capacitive elements,
   connecting means activated in response to a signal of said first level provided to said input node for connecting said other electrode of said second capacitive element to said control electrode of said output element,
   delay means for delaying a signal applied to said input node for a predetermined time, and
   coupling means activated in response to a signal of said first level from said delay means for coupling said control electrode to said second potential source, said coupling means being activated after inactivation of said shorting means and activation of said connecting means.

2. A buffer circuit comprising:
   a first potential source for supplying a potential of a first level,
   a second potential source for supplying a potential of a second level,
   an output element coupled to said first potential source and an output node, said output element having a control electrode and said output element being responsive to a signal applied to said control electrode for driving said output node to said first level,
   a first capacitive element having one electrode coupled to said first potential source and the other electrode coupled to said control electrode,
   a second capacitive element having one electrode and another electrode, said one electrode of said second capacitive element being coupled to said second potential source,
   shorting means activated in response to a signal of said second level provided to an input node for shorting said one electrode and said other electrode of said first capacitive element and shorting said first electrode and said other electrode of said second capacitive element,
   connecting means activated in response to a signal of said first level provided to said input node for connecting said other electrode of said second capacitive element to said control electrode of said output element,
   potential detection means for detecting whether the potential of said output node has reached a predetermined potential level between said first level and said second level, and
   coupling means responsive to the potential detecting means detecting that the potential reaches the predetermined potential for coupling said control electrode of said output element to said second potential source.

3. A buffer circuit having an input node for receiving a signal and an output node for providing a signal, comprising:
   a first potential source for supplying a potential of a first level,
   a second potential source for supplying a potential of a second level,
   a first switching element coupled to said first potential source and an output node, said first switching element having a control electrode and said first switching element being responsive to a signal applied to said control electrode for driving said output node to said first level,
   a first capacitive element having one electrode coupled to said first potential source and the other electrode coupled to said control electrode,
   a second capacitive element having one electrode and another electrode, said one electrode of said second capacitive element being coupled to said second potential source,
   a second switching element provided in parallel with said first capacitive element, responsive to a signal applied to said input node for selectively shorting said one electrode and said other electrode of said first capacitive element,
   a third switching element provided in parallel with said second capacitive element, responsive to a signal applied to aid input node for selectively shorting said one electrode and said other electrode of said second capacitive element,
   a fourth switching element provided between said other electrode of said second capacitive element and said control electrode, responsive to a signal applied to said input node for selectively connecting said other electrode of said second capacitive element to said control electrode,
   delay means for delaying a signal applied to said input node for a predetermined time, and a fifth switching element responsive to an output of said delay means for selectively connecting said control electrode to said second potential source.

4. A buffer circuit having an input node for receiving an input signal and an output node for providing a signal, comprising:

a first potential source for supplying a potential of a first level, a second potential source for supplying a potential of a second level, a first switching element coupled to said first potential source and an output node, said first switching element having a control electrode and said first switching element being responsive to a signal applied to said control electrode for driving said output node to said first level, a first capacitive element having one electrode coupled to said first potential source and the other electrode coupled to said control electrode, a second capacitive element having one electrode and another electrode, said one electrode of said second capacitive element being coupled to said second potential source, a second switching element provided in parallel with said first capacitive element, responsive to a signal applied to said input node for selectively shorting said one electrode and said other electrode of said first capacitive element, a third switching element provided in parallel with said second capacitive element, responsive to a signal applied to said input node for selectively shorting said one electrode and said other electrode of said second capacitive element, a fourth switching element provided between said other electrode of said second capacitive element and said control electrode of said first switching element, responsive to a signal applied to said input node for selectively connecting said other electrode of said second capacitive element to said control electrode, potential detecting means for detecting whether the potential of said output node has reached a predetermined potential between said first level and said second level, and a fifth switching element responsive to an output of said potential detecting means for connecting said control electrode and said second potential source.

5. A buffer circuit having an input node for receiving a signal and an output node for providing a signal, comprising:

a first potential source for supplying a potential of a first level, a second potential source for supplying a potential of a second level, a first field effect transistor coupled to said first potential source and an output node, said first field effect transistor having a control electrode and being responsive to a signal applied to said control electrode for supplying current and voltage from said first potential source, a bipolar type transistor responsive to an output from said first field effect transistor for driving said output node to said first level, a first capacitive element having one electrode coupled to said first potential source, and the other electrode coupled to said control electrode of said first field effect transistor, a second capacitive element having one electrode and another electrode, said one electrode of said second capacitive element being connected to said second potential source, a second field effect transistor provided in parallel with said first capacitive element, responsive to a signal applied to said input node for shorting said first electrode and said other electrode of said first capacitive element, a third field effect transistor provided in parallel with said second capacitive element, responsive to a signal applied to said input node for shorting said one electrode and said other electrode of said second capacitive element, a fourth field effect transistor responsive to a signal applied to said input node for coupling said other electrode of said second capacitive element to said control electrode of said first field effect transistor, wherein said third field effect transistor and said fourth field effect transistor are turned on and off in a complementary manner, delay means for delaying a signal applied to said input node for a predetermined time, and a fifth field effect transistor responsive to an output of said delay means for coupling said control electrode of said first field effect transistor to said second potential source.

6. A buffer circuit having an input node for receiving a signal and an output node for providing a signal, comprising:

a first potential source for supplying a potential of a first level, a second potential source for supplying a potential of a second level, a first field effect transistor coupled to said first potential source and a first node, said first field effect transistor having a control electrode and being responsive to a signal applied to said control electrode for driving said first node to said first level, a bipolar type transistor responsive to a signal on said first node for coupling said output node to said second potential source, a first capacitive element provided between said second potential source and the control electrode of said first field effect transistor, a first switching element provided in parallel with said first capacitive element, responsive to a signal applied to said input node for shorting said first capacitive element, a second capacitive element having one electrode and another electrode, said one electrode of said second capacitive element being coupled to said first potential source, a second switching element provided in parallel with said second capacitive element, responsive to s a signal applied to said input node for shorting said one electrode and said other electrode of said second capacitive element, a third switching element responsive to a signal applied to said input node for coupling said other electrode of said second capacitive element to said control electrode of said field effect transistor, wherein said third switching element and said second switching element are turned on and off in a complementary manner, delay means for delaying a signal applied to said input node for a predetermined time, and a fourth switching element responsive to an output of said delay means for shorting said control electrode of said first field effect transistor and said first potential source.

7. A buffer circuit having an input node for receiving a signal and an output node for providing a signal, comprising:

a first potential source for supplying a potential of a first level, a field effect transistor coupled to said first potential source and a first node, said field effect transistor having a control electrode, and being responsive to a signal applied to said control electrode for driving said first node to said first level, a bipolar type transistor responsive to a signal on said first node for coupling said output node to said second potential source, a first capacitive element provided between said first potential source and said control electrode, a first switching element responsive to a signal applied to said input node for shorting said first capacitive element, a second capacitive element having one electrode and another electrode, said one electrode of said second capacitive element being connected to said second potential source, a second switching element responsive to a signal applied to said input node for shorting said second capacitive element, a third switching element responsive t a signal applied to said input node for connecting said other electrode of said second capacitive element and said control electrode of said field effect transistor, wherein said third switching element is turned on and off in a complementary manner with said first and second switching elements, potential detecting means for detecting whether the potential of said output node has reached a predetermined potential between said first level and said second level, and a fourth switching element responsive to an output of said potential detecting means for coupling said control electrode of said field effect transistor and said second potential source.

8. A buffer circuit having an input node for receiving a signal and an output node for providing a signal, comprising:

a first potential source for supplying a potential of a first level, a second potential source for supplying a potential of a second level, a first field effect transistor coupled to said first potential source and a first node, said first field effect transistor having a control electrode and being responsive to a signal applied to said control electrode for for driving said first node to said first level, a bipolar type transistor responsive to a signal on said first node for coupling said output node and said second potential source, a first capacitive element provided between said second potential source and the control electrode of said field effect transistor, a first switching element responsive to a signal applied to said input node for shorting said first capacitive element, a second capacitive element having one electrode and another electrode, said one electrode of said second capacitive element being coupled to said first potential source, a second switching element responsive to a signal applied to said input node for shorting said second capacitive element, a third switching element responsive to a signal applied to said input node for coupling said other electrode of said second capacitive element to said control electrode of said field effect transistor, wherein said third switching element is turned on and off in a complementary manner with said first and second switching elements, potential detecting means for detecting whether the potential of said output node has reached a predetermined potential level, and a fourth switching element responsive to an output of said potential detecting means for coupling said control electrode of said field effect transistor to said first potential source.

9. A method of driving a buffer circuit including an input node for receiving a signal, an output node, and an output drive element having a control gate, for driving the output node to a first potential node, comprising the steps of:

charging the control gate to the first potential level while coupling one electrode of a first capacitance connected to the control gate to the first potential level and coupling one electrode of a second capacitance isolated from the control gate to a second potential level;

bringing the control gate into a high impedance state with one electrode of the first capacitance disconnected from the first potential supply and connected to the control gate, in response to the signal at said input node;

de-connecting the one electrode of the second capacitance from the second potential level with the one electrode of the first capacitance connected to the control gate, in response to the signal at said input node; and connecting the control gate to the second potential level.

10. A method according to claim 9, wherein said connecting step includes the steps of delaying the signal at said input node by a predetermined time, and connecting the control gate to the second potential level in response to such delayed signal.

11. A method according to claim 9, wherein said connecting step includes the steps of detecting whether or not a signal at said output node reaches a predetermined potential level, and connecting the control gate to the second potential level in response to detection of reaching said predetermined potential.

12. A method according to claim 9, wherein said output drive element includes an insulated gate type transistor having said control gate, and a bipolar type transistor, and wherein said method further comprises the step of driving said bipolar type transistor in response to an output of said insulated gate type transistor, for driving said output node.

13. A method according to claim 9, wherein said output drive element comprises an insulated gate type field effect transistor driving the output node.

* * * * *